(12) United States Patent
Konishi et al.

(10) Patent No.: US 9,036,327 B2
(45) Date of Patent: May 19, 2015

(54) ELECTRONIC ELEMENT, VARIABLE CAPACITOR, MICRO SWITCH, METHOD FOR DRIVING MICRO SWITCH, AND MEMS TYPE ELECTRONIC ELEMENT

(71) Applicant: Nikon Corporation, Tokyo (JP)

(72) Inventors: Hiroshi Konishi, Ichikawa (JP); Junji Suzuki, Tama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/864,430

(22) Filed: Apr. 17, 2013

(65) Prior Publication Data

US 2013/0271805 A1  Oct. 17, 2013

Related U.S. Application Data

(63) Continuation of application No. 12/412,744, filed on Mar. 27, 2009, now Pat. No. 8,441,773, which is a continuation of application No. PCT/JP2007/068889, filed on Sep. 27, 2007.

(30) Foreign Application Priority Data

Sep. 27, 2006  (JP) .................................. 2006-262100
Jun. 2, 2007  (JP) .................................. 2007-147556

(51) Int. Cl.
*H01G 7/06* (2006.01)
*H01G 5/16* (2006.01)
(Continued)

(52) U.S. Cl.
CPC .............. *G02B 26/08* (2013.01); *B81B 3/0086* (2013.01); *B81B 2201/016* (2013.01);
(Continued)

(58) Field of Classification Search
USPC .................. 361/279, 277, 281, 290, 280, 287
See application file for complete search history.

(56) References Cited

U.S. PATENT DOCUMENTS

| 5,594,171 A | 1/1997 | Ishida et al. |
| 6,127,908 A | 10/2000 | Bozler et al. |

(Continued)

FOREIGN PATENT DOCUMENTS

| JP | 05-2976 A | 1/1993 |
| JP | 09-082569 A | 3/1997 |

(Continued)

OTHER PUBLICATIONS

Young et al., "A Micromachined Variable Capacitor for Monolithic Low-Noise VCOs", Solid-State and Actuator Workshop, Hilton Head S.C., Jun. 1996, pp. 86-89.

(Continued)

*Primary Examiner* — David M Sinclair
(74) *Attorney, Agent, or Firm* — Miles & Stockbridge P.C.

(57) ABSTRACT

An electronic element includes a fixed portion, and a movable portion which is movable with respect to the fixed portion and which is provided to generate a spring force to make restoration to a predetermined position. The fixed portion is provided with a first driving electrode and a first signal electrode. The movable portion is provided with a second driving electrode and a second signal electrode. An electrostatic force is generated between the first driving electrode and the second driving electrode by a voltage applied therebetween so that the electrostatic force resists against the spring force; and the first and second driving electrodes and the first and second signal electrodes are arranged so that the electrostatic force is generated in a direction in which a spacing distance between the first and second signal electrodes is widened.

9 Claims, 29 Drawing Sheets

(51) Int. Cl.
*H01G 7/00* (2006.01)
*G02B 26/08* (2006.01)
*B81B 3/00* (2006.01)
*H01G 5/18* (2006.01)
*H01L 23/522* (2006.01)
*H01L 27/08* (2006.01)

(52) U.S. Cl.
CPC *H01G 5/16* (2013.01); *H01G 5/18* (2013.01); *H01L 23/5223* (2013.01); *H01L 27/0808* (2013.01); *H01L 2924/3011* (2013.01); *H01L 2924/0002* (2013.01)

(56) References Cited

U.S. PATENT DOCUMENTS

| | | | |
|---|---|---|---|
| 6,242,989 B1 | 6/2001 | Barber et al. | |
| 6,437,965 B1 | 8/2002 | Adkins et al. | |
| 6,507,475 B1 | 1/2003 | Sun | |
| 6,531,947 B1* | 3/2003 | Weaver et al. | 337/139 |
| 6,621,392 B1 | 9/2003 | Volant et al. | |
| 6,665,109 B2* | 12/2003 | Little et al. | 359/290 |
| 6,747,775 B2* | 6/2004 | Little | 359/238 |
| 6,804,107 B2 | 10/2004 | Tuo et al. | |
| 6,822,779 B2* | 11/2004 | Chi | 359/290 |
| 7,054,132 B2 | 5/2006 | Yoshida et al. | |
| 7,141,989 B1 | 11/2006 | Liu | |
| 7,489,004 B2 | 2/2009 | Combi et al. | |
| 7,653,371 B2* | 1/2010 | Floyd | 455/262 |
| 2003/0043289 A1* | 3/2003 | Konno | 348/335 |
| 2003/0169146 A1 | 9/2003 | Kawai et al. | |
| 2003/0223176 A1 | 12/2003 | Fujii et al. | |
| 2005/0146241 A1* | 7/2005 | Wan | 310/309 |
| 2006/0056132 A1 | 3/2006 | Yoshida et al. | |
| 2006/0067840 A1 | 3/2006 | Kawakubo et al. | |
| 2008/0008464 A1* | 1/2008 | Schack et al. | 396/72 |
| 2009/0296309 A1 | 12/2009 | Morris et al. | |

FOREIGN PATENT DOCUMENTS

| | | |
|---|---|---|
| JP | 2003-264123 A | 9/2003 |
| JP | 2004-006310 A | 1/2004 |
| JP | 2004-172504 A | 6/2004 |
| JP | 2005-153068 A | 6/2005 |
| JP | 2006-93463 A | 4/2006 |
| KR | 10-2005-0086669 A | 8/2005 |
| WO | WO 2005/027257 A1 | 3/2005 |

OTHER PUBLICATIONS

International Search Report from underlying International Application No. PCT/JP2007/068889 dated Dec. 18, 2007.
Written Opinion of the International Search Authority issued Jan. 8, 2008 for the underlying International Application No. PCT/JP2007/068889.
Konishi et al., "Built-In Upwards-Bending Electrostatic Actuator Capable of Three-Level-Structural Variable Capacitor", The 14$^{th}$ International Conference on Solid-State Sensors, Actuators and Microsystems, Jun. 2007, pp. 447-450.
Office Action dated Jan. 16, 2014 issued in Korean Patent Application No. 10-2009-7002525.
Preliminary Notice of First Office Action and Search Report dated Feb. 6, 2014, issued in Taiwanese Patent Application No. 096135915.
Office Action dated Aug. 22, 2014, in Korean Patent Application No. 10-2014-7013071.

* cited by examiner

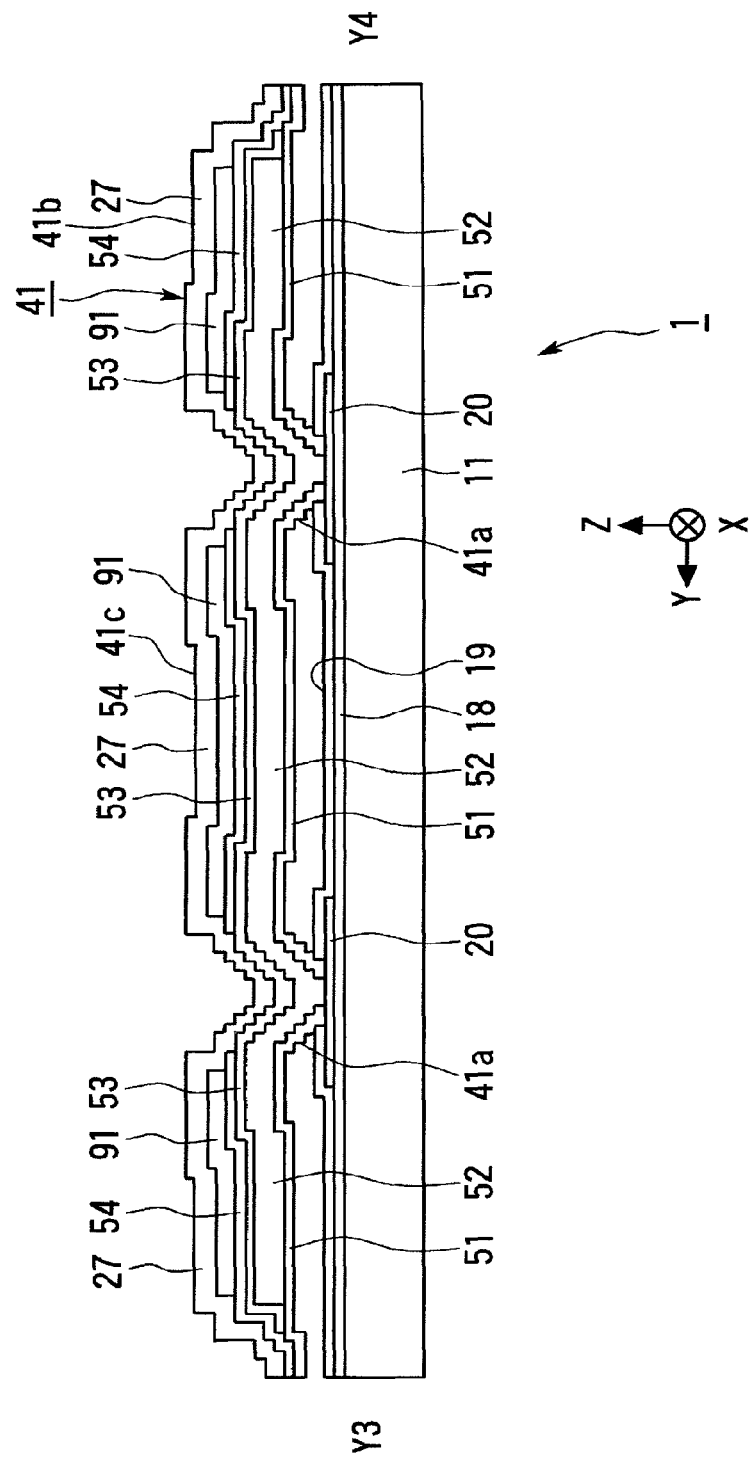

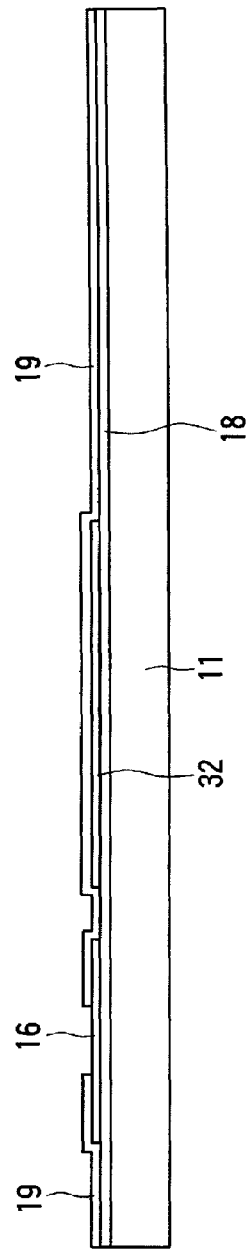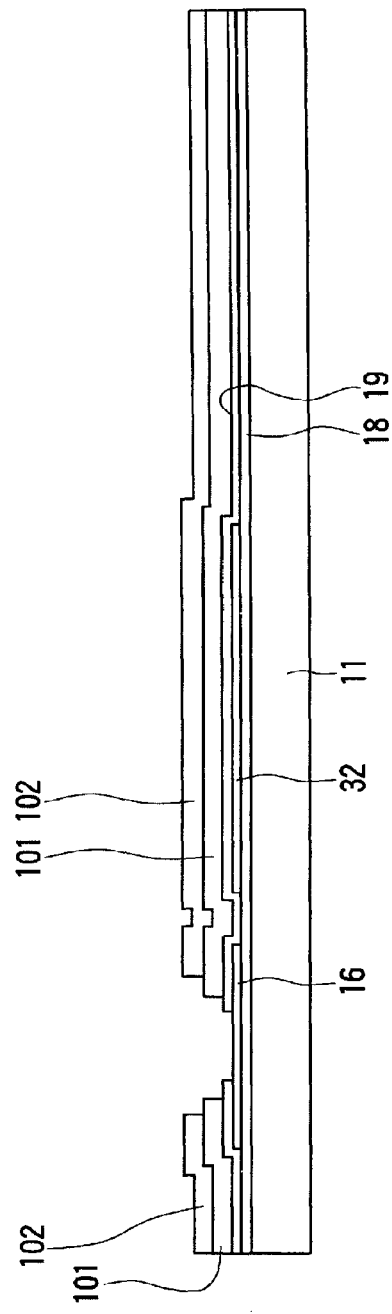

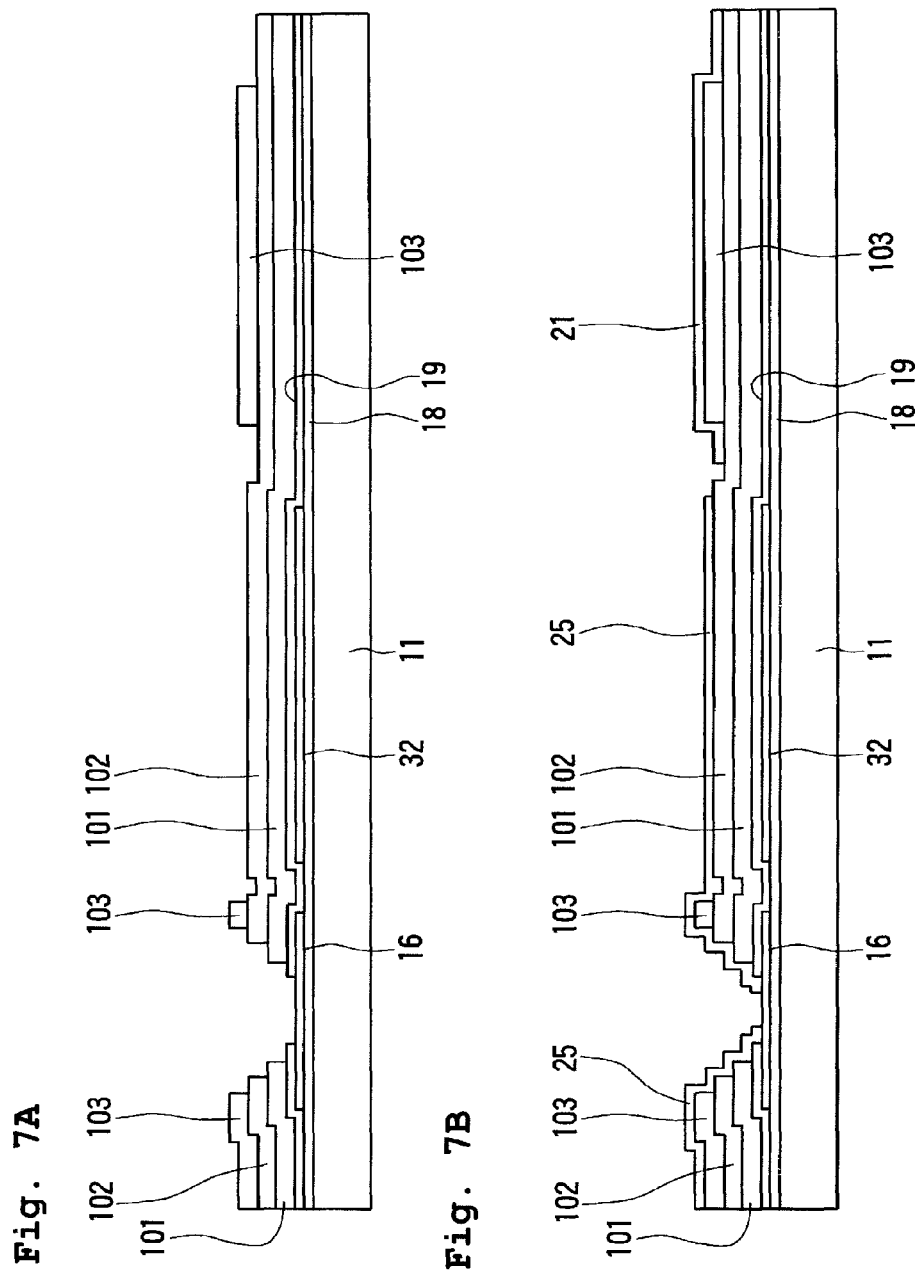

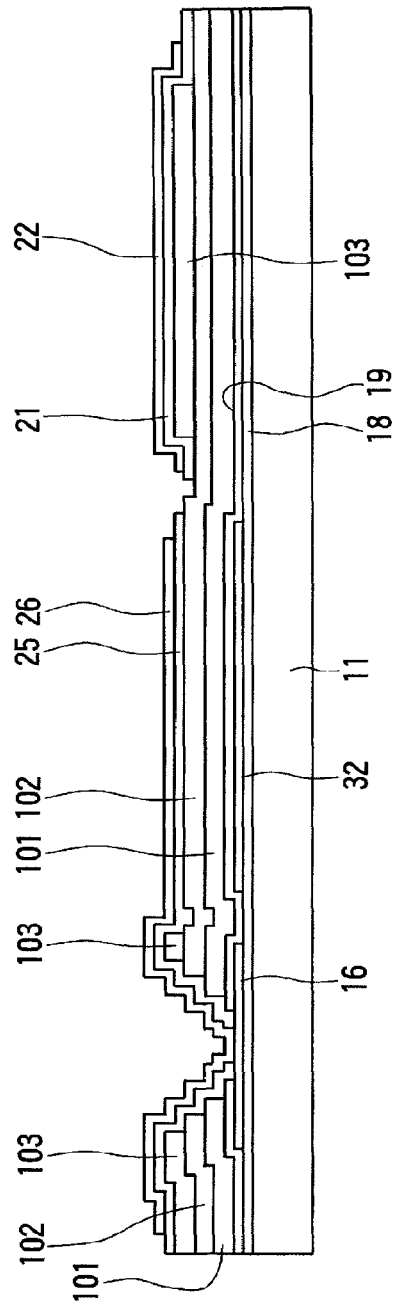
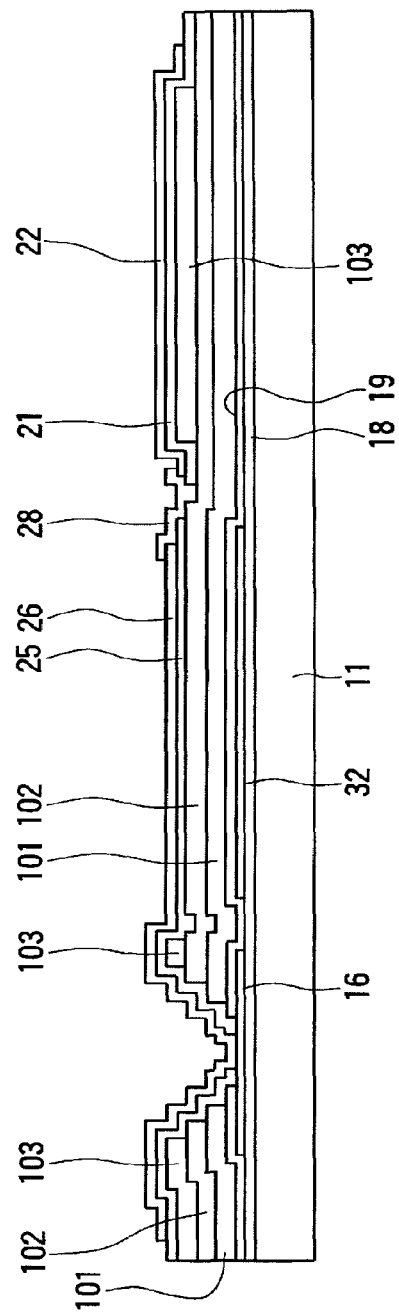

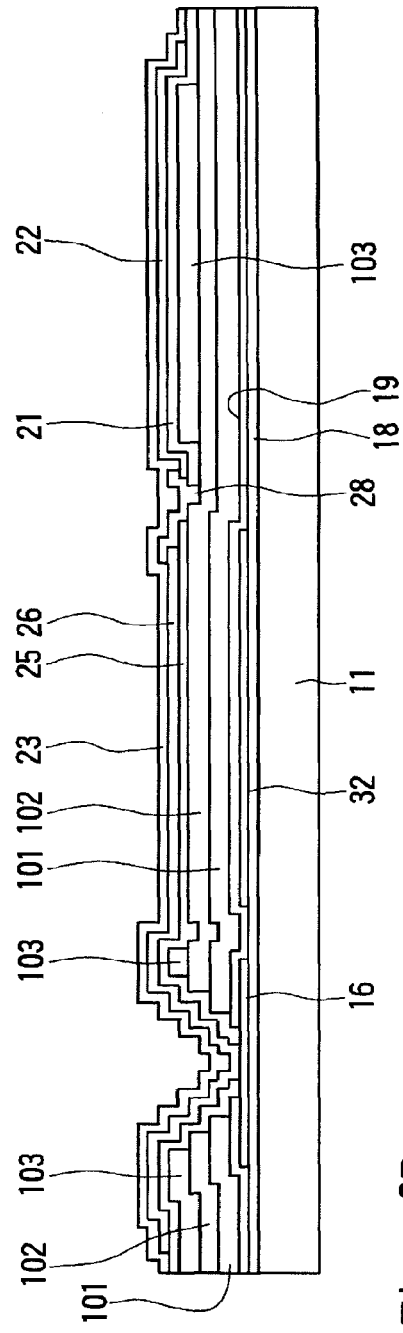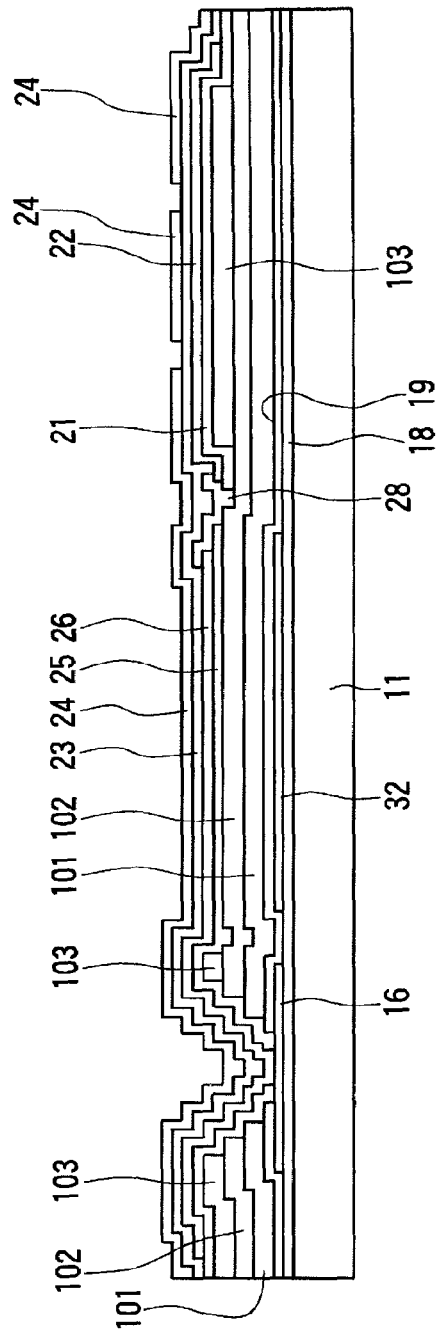

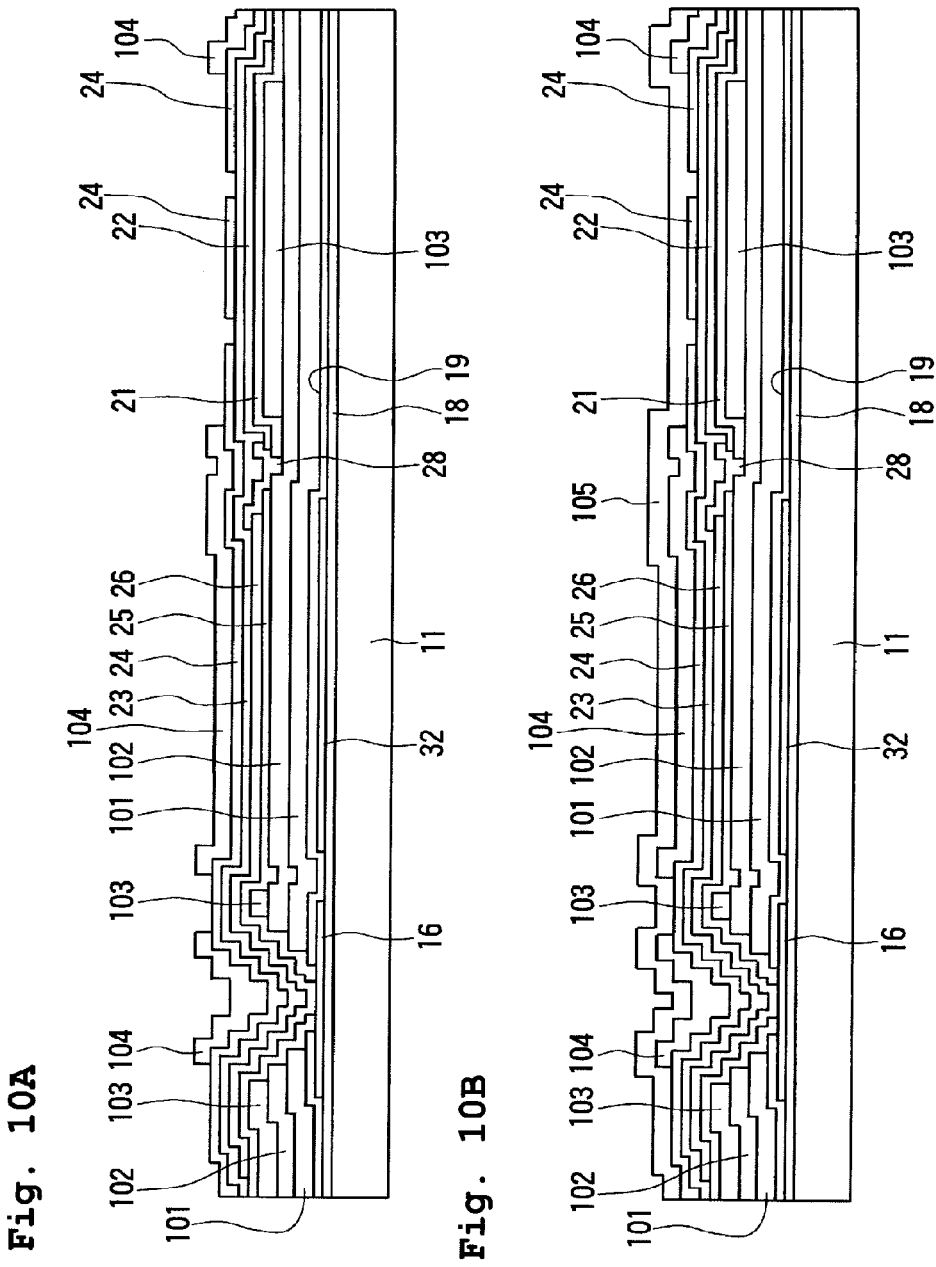

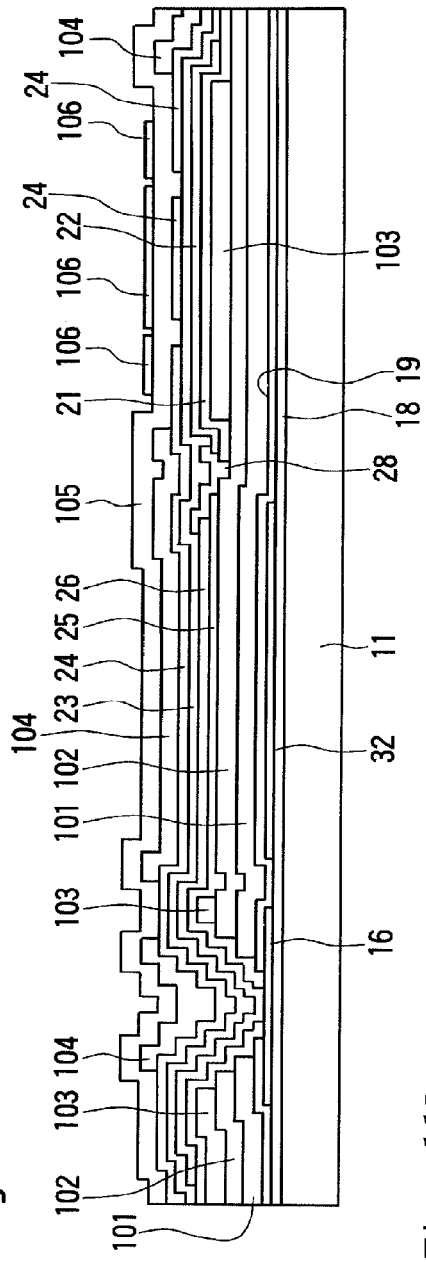

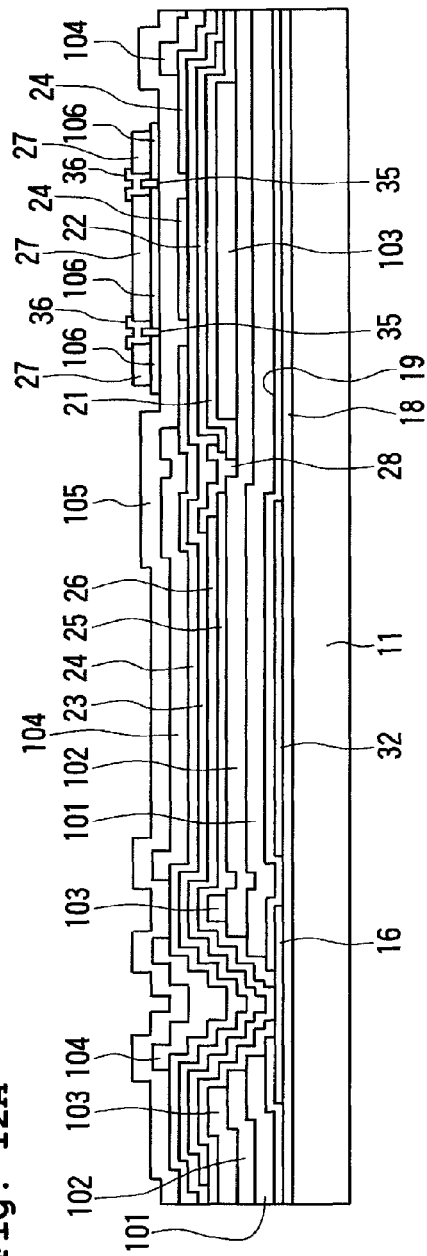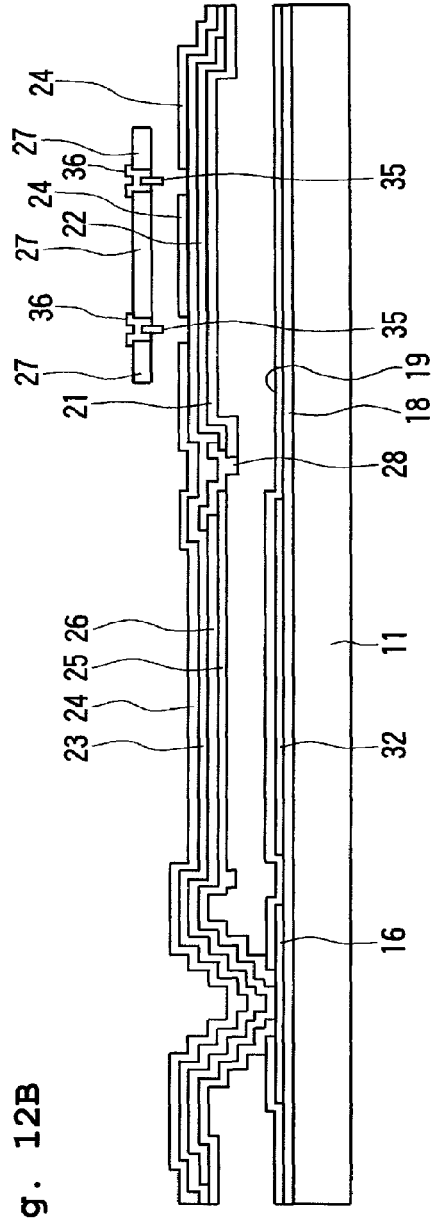

Fig. 19
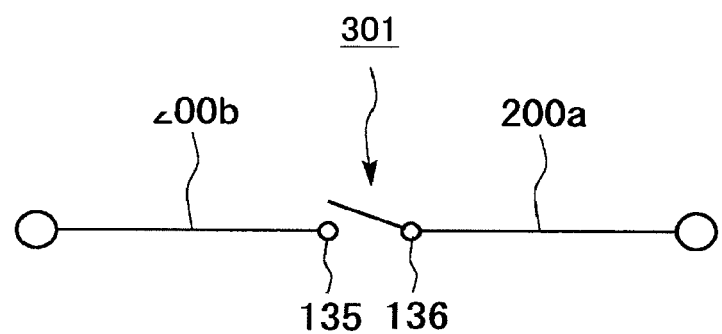
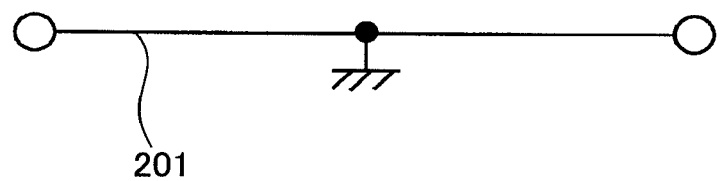

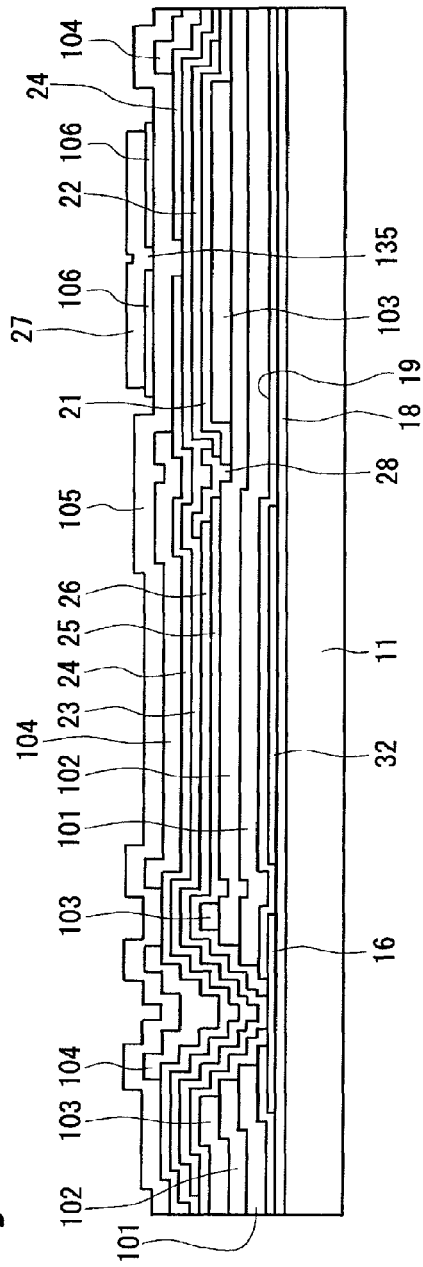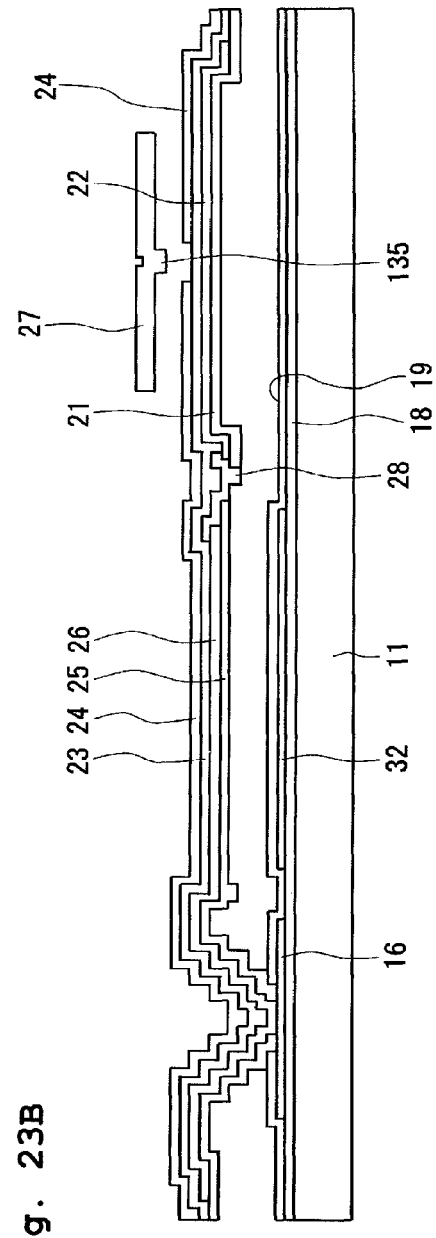
Fig. 23A
Fig. 23B

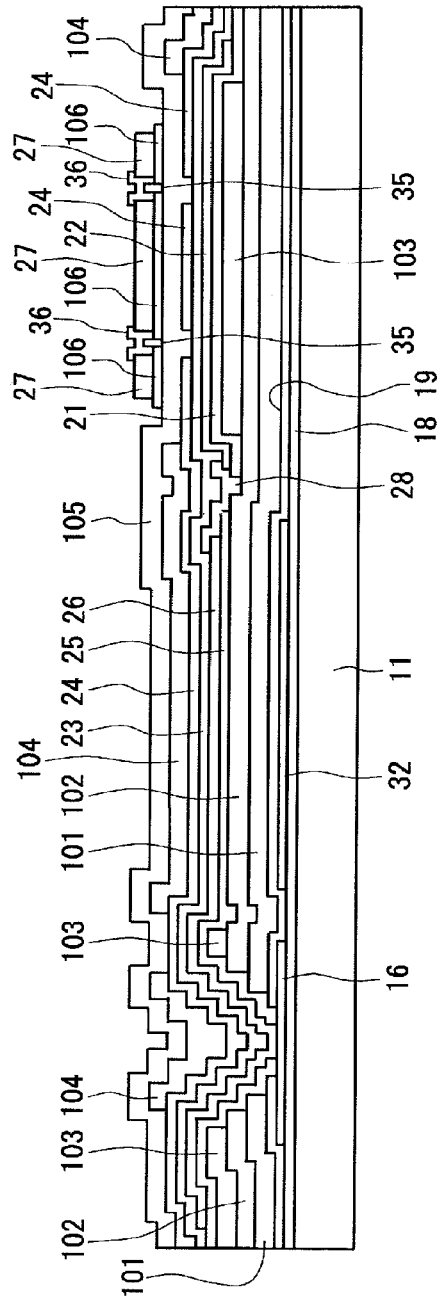
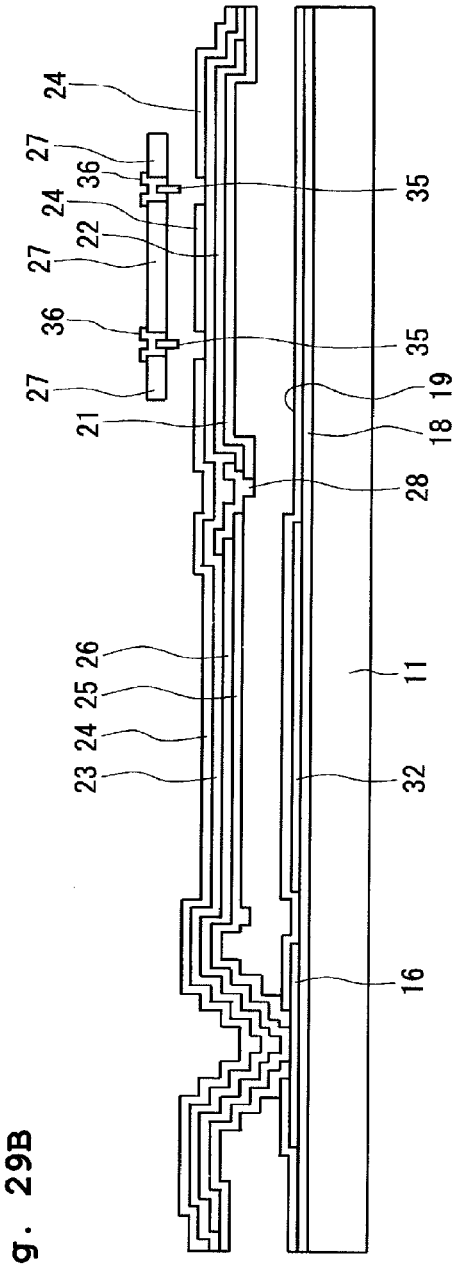
Fig. 29A
Fig. 29B

ELECTRONIC ELEMENT, VARIABLE CAPACITOR, MICRO SWITCH, METHOD FOR DRIVING MICRO SWITCH, AND MEMS TYPE ELECTRONIC ELEMENT

CROSS-REFERENCE

This application is a Continuation Application of International Application No. PCT/JP2007/068889 which was filed on Sep. 27, 2007 claiming the conventional priority of Japanese patent Applications No. 2006-262100 filed on Sep. 27, 2006 and No. 2007-147556 filed on Jun. 2, 2007.

BACKGROUND OF THE INVENTION

1. Field of the Invention

The present invention relates to an electronic element, a variable capacitor, a micro switch, a method for driving the micro switch, and an MEMS type electronic element. As for the variable capacitor, an actuator is used. The variable capacitor is usable, for example, for a wireless communication apparatus, an RF measuring apparatus, etc. The micro switch is exemplified by the so-called MEMS (Micro-Electro-Mechanical System) switch, or the like. The micro switch includes, for example, a high frequency switch (RF switch) to be used, for example, for a wireless communication apparatus or an RF measuring apparatus, and a switch for the DC signal or the low frequency signal.

2. Description of the Related Art

The wireless communication or radio communication technique, which uses the mobile phone device, etc., is advanced, and the importance is enhanced for the variable capacitor and the micro switch to be used, for example, for the high frequency circuit.

Conventionally, a varactor, which is a semiconductor device, is used as the variable capacitor to be used for the high frequency circuit, etc. However, the Q value of the varactor is small, and various inconveniences arise.

"A micromachined variable capacitor for monolithic low-noise VCOs" by Darrin J. Young and Bernhard E. Boser, Solid-State and Actuator Workshop, Hilton Head, June 1996, pp. 86-89, which is a non-patent document (general scientific or technical document) discloses a variable capacitor which is formed by using the technique of MEMS (Micro-Electro-Mechanical System) as the variable capacitor having a large Q value. The variable capacitor includes a fixed electrode and a movable electrode which are arranged to construct plane-parallel. A movable portion is supported by a support portion having a flexible structure. The movable portion is movable toward the fixed electrode from a position separated (away) from the fixed electrode by a predetermined spacing distance (initial spacing distance). By the movement of the movable portion, the capacitance or electric capacity of the variable capacitor is changed.

When the driving voltage is applied between the both electrodes, the movable portion is moved toward the fixed electrode by the electrostatic force. When the movable portion is moved, then the support portion having the flexible structure is warped or flexibly bent to thereby generate the spring force. The spring force is generated in a direction so as to return the spacing distance between the both electrodes to the predetermined spacing distance (initial spacing distance). Therefore, the both electrodes are stabilized at the point at which the electrostatic force and the spring force are balanced with each other, and the capacitance, which is to be used as the output, is formed. That is, the both electrodes function as the capacitance electrodes, and function also as the driving electrodes for generating the electrostatic force resisting against the spring force in order to adjust the spacing distance between the both electrodes. In the variable capacitor, the capacitance is changed (controlled) in accordance with the balance between the spring force and the electrostatic force. Therefore, the variable capacitor has such an advantage that the electric power consumption is small.

However, the variable capacitor disclosed in "A micromachined variable capacitor for monolithic low-noise VCOs" has a low variable capacitance ratio (capacitance change ratio). The reason thereof will be explained below.

In the variable capacitor disclosed in "A micromachined variable capacitor for monolithic low-noise VCOs", when the movable electrode is driven, the movable electrode is stopped at a position at which the electrostatic force between the fixed electrode and the movable electrode is balanced with the spring force. The spring force is proportional to the amount of change of the spacing distance between the both electrodes from the initial spacing distance. As the spacing distance between the both electrodes is narrower, the spring force becomes greater. On the other hand, the electrostatic force is proportional to the square of the voltage between the both electrodes, and the electrostatic force is inversely proportional to the square of the spacing distance between the both electrodes. As the spacing distance between the both electrodes is narrower, the electrostatic force becomes greater. That is, when the spacing distance between the both electrodes is changed, the spring force is changed proportionally to the amount of change, while the electrostatic force is changed inversely proportional to the square of the amount of change. Therefore, the spring force and the electrostatic force can be balanced with each other within a certain limited spacing distance range, but the spring force and the electrostatic force cannot be balanced with each other at any position exceeding the range.

In the case of the variable capacitor disclosed in "A micromachined variable capacitor for monolithic low-noise VCOs", the spring force and the electrostatic force can be stably balanced with each other by the voltage applied between the both electrodes until the spacing distance therebetween arrives at a spacing distance which is about ⅓ of the initial spacing distance. The spring force and the electrostatic force can be stably balanced with each other within a range from the initial spacing distance of the spacing distance between the both electrodes to the spacing distance of about ⅓ of the initial spacing distance. The movable electrode can be stably stopped at any spacing distance between the electrodes, within the above spacing distance range, depending on the applied voltage.

In the variable capacitor disclosed in "A micromachined variable capacitor for monolithic low-noise VCOs", however, when the voltage applied between the both electrodes is increased and when the spacing distance between the both electrodes becomes narrower than the spacing distance of about ⅓ of the initial spacing distance, then the spring force and the electrostatic force cannot be stably balanced with each other. That is, in relation to positions at each of which the spacing distance between the both electrodes is narrower than the spacing distance of about ⅓ of the initial spacing distance, the electrostatic force exceeds the spring force at each of such positions. As a result, the movable electrode is moved to a limit position at which the movable electrode approaches closest to the fixed electrode, irrelevant to the magnitude of the voltage (voltage magnitude) at any driving voltage of not less than the voltage at which the spacing distance between the both electrodes is the spacing distance of about ⅓ of the initial spacing distance. The so-called pull-in phenomenon, in which the spacing distance cannot be controlled by the voltage, consequently arises in the variable capacitor. The minimum voltage, at which the pull-in phenomenon begins to arise, is hereinafter referred to as "pull-in voltage".

Therefore, in the variable capacitor disclosed in "A micromachined variable capacitor for monolithic low-noise VCOs", the spacing distance between the both electrodes can be controlled by the driving voltage only within the range of the spacing distance in which the spacing distance between the both electrodes is not more than about ⅓ of the initial spacing distance. That is, in the variable capacitor disclosed in "A micromachined variable capacitor for monolithic low-noise VCOs", a range (continuous adjustable range), in which the spacing distance between the both electrodes can be continuously adjusted by the voltage applied between the both electrodes, is practically limited to the range from the initial spacing distance to the spacing distance of about ⅓ thereof.

In the variable capacitor disclosed in "A micromachined variable capacitor for monolithic low-noise VCOs", the fixed electrode and the movable electrode are not only used as the driving electrodes for adjusting the spacing distance therebetween, but are used also as the capacitance electrodes for forming the capacitance to be outputted. The capacitance, which is formed between the both electrodes, is inversely proportional to the spacing distance between the both electrodes. When the spacing distance between the both electrodes is decreased, the capacitance is increased. As described above, the spacing distance between the both electrodes can be controlled within the range from the initial spacing distance (widest spacing distance) to the spacing distance of about ⅓ thereof. Therefore, the variable capacitor disclosed in "A micromachined variable capacitor for monolithic low-noise VCOs" can be controlled, by the control based on the driving voltage, until arrival at a capacitance which is about 1.17 times the capacitance in the initial state, provided that the capacitance in the initial state is 1. The variable capacitance ratio (capacitance change ratio) is extremely low, for example, as compared with the variable capacitance ratio (capacitance change ratio) to be obtained if the control is made with the same or equivalent electrode control range from a spacing distance between the both electrodes which is substantially zero.

On the other hand, a switch, which is a semiconductor device including PIN-DIODE, MOS-FET, etc. has been hitherto used as the micro switch.

However, as the wireless communication technique is advanced in recent years, the frequency used in the wireless communication technique is in a high band of several GHz to several 10 GHz. In the high frequency band, the transmission loss, which results from the low Q of the switch which is the conventional semiconductor device, becomes a problem. In future, there is a possibility that, for example, the mobile or portable terminal is required to cover various frequency bands with one mobile or portable terminal. In such a situation, it is postulated that the number of the switches to be used to switch or select the frequency band would be increased. In such usage, a problem arises such that the switch which is a semiconductor device, consumes high electric power.

In view of the above, MEMS switches, which are constructed variously, have been suggested as the RF switch. The MEMS type RF switch performs the switching in accordance with the MEMS technique. Therefore, it is possible to suppress the transmission loss to be sufficiently low. The MEMS type RF switch can be classified into the so-called serial coupling resistance type switch (hereinafter referred to as "serial type switch") and the parallel coupling capacitance type switch (hereinafter referred to as "parallel type switch") based on the way of connection or wiring with respect to the transmission line path.

The serial type switch is disclosed, for example, in Japanese Patent Application Laid-open No. 5-2976. A serial type switch is connected in series to one transmission line path. The serial type switch functions as the switch such that the electric contact of the fixed portion and the electric contact of the movable portion make contact with each other or separation from each other. The serial type switch can be used not only as the RF switch, but the serial type switch can be also sued as the switch for the DC signal or the low frequency signal.

The parallel type switch is disclosed, for example, in Japanese Patent Application Laid-open No. 2004-6310. A parallel type switch has the capacitance, and the capacitance is connected in parallel to a pair of high frequency transmission line paths. By changing the distance of the movable portion from the fixed portion in the parallel type switch, the capacitance of the parallel type switch is changed, and the transmission signal band is changed. The inputted high frequency signal is shunted or not shunted to the ground conductor depending on the magnitude of the capacitance. The state, in which the high frequency signal is shunted to the ground conductor, corresponds to the OFF state of the switch. The state, in which the high frequency signal is not shunted to the ground conductor, corresponds to the ON state of the switch.

The MEMS switch adopts the electrostatic driving system in which the movable portion is driven by the electrostatic force in order to perform the switching operation. Therefore, the MEMS switch is an electronic element in which the electric power consumption is low.

However, the conventional MEMS type RF switch, which adopts the electrostatic driving system, requires the high driving voltage, even when the conventional MEMS type RF switch is either the serial type switch or the parallel type switch. The reason for this will be explained below while being divided into the case of the serial type switch and the case of the parallel type switch. Note that the serial type switch requires high driving voltage, either when the serial type switch is used as the RF switch or when the serial type switch is used as the switch for the DC signal or the low frequency signal.

The conventional serial type switch described in Japanese Patent Application Laid-open No. 5-2976, which adopts the electrostatic driving system, has a substrate and a movable portion. The movable portion is held by a support portion in a state that the movable portion is separated from the substrate. The substrate has a fixed driving electrode and a fixed electric contact at a portion of the substrate, the portion being opposite to or facing the movable portion. The movable portion has a movable driving electrode and a movable electric contact at a portion of the movable portion, the portion being opposite to or facing the substrate. When the voltage is applied, the electrostatic force is generated between the both driving electrodes so that the spacing distance between the both contacts is narrowed. The movable portion is displaced by the electrostatic force, and the movable portion functions as a plate spring. When a predetermined voltage is applied between the both driving electrodes so that the electrostatic force, which is greater than the restoring force of the plate spring, is generated, then the both contacts make contact with each other against the restoring force of the plate spring, and the switch is in the ON state.

The spring force of the movable portion is generated in accordance with the Hooke's law, which is proportional to the amount of change from the initial spacing distance in relation to the spacing distance between the both driving electrodes. On the other hand, the electrostatic force is proportional to the square of the voltage between the both driving electrodes, and the electrostatic force is inversely proportional to the square of the spacing distance between the both driving electrodes. It is necessary that the pull-in voltage or a voltage of not less than the pull-in voltage is applied, between the both driving electrodes of the serial type switch, as the voltage which makes it possible to allow the both driving electrodes to make contact with each other against the restoring force of the plate spring.

On the other hand, when the voltage is not applied between the both driving electrodes, then the electrostatic force is not generated between the both driving electrodes, and thus the movable portion is returned to the initial position in accordance with the restoring force of the spring, thereby separating the both contacts from each other and turning the switch to the OFF state. As described above, in order to perform the switching between the ON state and the OFF state of the switch by controlling the voltage applied between the both driving electrodes, it is necessary that the voltage between the both driving electrodes should be switched between no voltage and the pull-in voltage or the voltage of not less than the pull-in voltage.

In the conventional serial type switch as described above, the passing loss (loss caused by the contact resistance) of the signal between the both electric contacts is generated in the state (ON state) in which the electric contacts make contact with each other. In order to reduce the passing loss, it is necessary that the contact pressure between the both contacts is increased. In general, a technique is adopted, in which the contact pressure between the both contacts is increased by increasing the electrostatic force in the ON state.

When the ON state is released to the OFF state, the movable driving electrode is not separated from the fixed driving electrode at the pull-in voltage. The movable driving electrode is separated from the fixed driving electrode at a voltage smaller than the pull-in voltage by the spring force (opening or releasing spring force) obtained in that situation. The applied voltage-displacement curve of the movable driving electrode is a hysteresis curve in which the open circuit voltage is lower than the applied voltage.

Therefore, if the spring constant of the plate spring is decreased in order to decrease the pull-in voltage, any opening spring force, which is sufficient to separate the movable driving electrode from the fixed driving electrode, is not obtained consequently. If any sufficient opening spring force is not obtained, the movable electric contact is not separated from the fixed electric contact. Therefore, the serial type switch does not function as the switch.

Therefore, in order to reliably open the electric contacts, it is necessary that the restoring force of the spring of the movable portion is increased to some extent. As described above, in the conventional serial type switch, in view of the signal pass characteristic (low loss) and the operation reliability, it is necessary to make the design so that the pull-in voltage has a magnitude of some extent. Further, it is necessary that the driving voltage for allowing the switch to be in the ON state is not less than the pull-in voltage.

The conventional parallel type switch, which adopts the electrostatic driving system, has a substrate and a movable portion. The movable portion is stacked on the substrate with a dielectric intervening therebetween. The movable portion is supported while being separated from the substrate so that the movable portion functions as the plate spring. A fixed driving electrode and a fixed capacitance electrode are provided at a portion, of the substrate, which is opposite to or faces the movable portion. The movable portion has a movable driving electrode and a movable capacitance electrode at a portion, of the movable portion, which is opposite to the substrate. When the voltage is applied between the both driving electrodes, then the electrostatic force is generated, and the spacing distance between the both capacitance electrodes is narrowed. The capacitance, which is brought about by the both capacitance electrodes, is provided in parallel to the high frequency transmission line path. When a predetermined voltage (pull-in voltage), which generates the electrostatic force greater than the restoring force of the plate spring, is applied between the both driving electrodes, then the spacing distance between the both capacitance electrodes becomes narrowest, thereby maximizing and the capacitance between the both capacitance electrodes. This causes the inputted high frequency signal to be shunted to the ground conductor, and the switch is in the OFF state. On the other hand, when the voltage is not applied between the both driving electrodes, then the electrostatic force is not generated between the both driving electrodes, and the movable portion is returned to the initial position by the restoring force of the spring, thereby increasing the spacing distance between the both capacitance electrodes and decreasing the capacitance brought about by the both capacitance electrodes. The inputted high frequency signal is transmitted without being shunted to the ground conductor, and the switch is in the ON state. By controlling the voltage between the both driving electrodes as described above, it is possible to switch the ON state and the OFF state of the switch.

In the conventional parallel type switch as described above, as the spacing distance between the both capacitance electrodes in the ON state is greater, the capacitance becomes smaller. Therefore, it is possible to lower the insertion loss by the switch. The capacitance is increased when the spacing distance between the both capacitance electrodes is decreased as narrow as possible in the OFF state. Therefore, it is possible to enhance the cutoff characteristic (isolation) of the high frequency signal. Therefore, in the parallel type switch, it is desirable that the initial spacing distance between the both capacitance electrodes is increased; and that the movable driving electrode is movable to a great extent. These features cause a factor to raise the driving voltage. As described above, in the conventional parallel type switch, in view of the signal pass characteristic, the initial spacing distance between the both driving electrodes has to be designed to be great, and the driving voltage has to be made great.

As described above, in any one of the serial type switch and the parallel type switch, the conventional MEMS type RF switch adopting the electrostatic driving system requires the high driving voltage in view of the signal pass characteristic and the reliability. Therefore, it has been difficult to provide the conventional MEMS type RF switch on the mobile or portable terminal, etc. which is required to be driven at a low voltage of about several V or less. The serial type switch also requires the high driving voltage not only when the serial type switch is used as the RF switch but also when the serial type switch is used as the switch to perform the switching for the DC signal and the low frequency signal.

The present invention has been made taking the foregoing situations into consideration, an object of which is to provide a variable capacitor which is capable of enhancing the variable capacitance ratio while making the capacitance to be variable by utilizing the electrostatic force.

Another object of the present invention is to provide a micro switch which is capable of decreasing the driving voltage without causing any special inconvenience or problem even when the electrostatic drying system is adopted, and a method for driving such micro switch.

Still another object of the present invention is to provide an electronic element which is capable of being driven in a movement range that is equivalent to or not less than the conventional movement range within a range of the driving voltage smaller than the pull-in voltage, as well as a variable capacitor, a micro switch, a method for driving the micro switch, and an MEMS type electronic element.

SUMMARY OF THE INVENTION

According to a first aspect of the present invention, there is provided an electronic element comprising: a fixed portion; and a movable portion which is movable with respect to the fixed portion and which is provided to generate a spring force to cause restoration of the movable portion to a predetermined position; wherein the fixed portion has a first driving electrode and a first signal electrode; the movable portion has a second driving electrode and a second signal electrode; an electrostatic force is generated between the first driving electrode and the second driving electrode by a voltage applied between the first driving electrode and the second driving electrode so that the electrostatic force resists against the spring force; and the first driving electrode, the second driving electrode, the first signal electrode, and the second signal electrode are arranged so that the electrostatic force generated between the first driving electrode and the second driving electrode is generated in a direction in which a spacing distance between the first signal electrode and the second signal electrode is widened.

The electronic element according to the present invention can be driven in a movement range which is equivalent to or not less than the conventional movement range within a range of the driving voltage which is smaller than the pull-in voltage.

According to a second aspect of the present invention, there is provided a variable capacitor comprising a fixed portion, and a movable portion which is movable with respect to the fixed portion and which is provided to generate a spring force to cause restoration of the movable portion to a predetermined position; wherein the fixed portion has a first driving electrode and a first capacitance electrode; the movable portion has a second driving electrode and a second capacitance electrode; an electrostatic force is generated between the first driving electrode and the second driving electrode by a voltage applied between the first driving electrode and the second driving electrode so that the electrostatic force resists against the spring force; and the first driving electrode, the second driving electrode, the first capacitance electrode, and the second capacitance electrode are arranged so that the electrostatic force generated between the first driving electrode and the second driving electrode is generated in a direction in which a spacing distance between the first capacitance electrode and the second capacitance electrode is widened.

In the variable capacitor according to the present invention, the spacing distance between the first capacitance electrode and the second capacitance electrode may be narrower than a spacing distance between the first driving electrode and the second driving electrode in a state that the electrostatic force is not generated between the first driving electrode and the second driving electrode.

In the variable capacitor according to the present invention, a projection, which defines a minimum spacing distance between the first capacitance electrode and the second capacitance electrode, may be provided on the fixed portion or the movable portion.

In the variable capacitor according to the present invention, a capacitance, which is to be used as an output, may be formed by the first capacitance electrode and the second capacitance electrode.

In the variable capacitor according to the present invention as described above, the variable capacitance ratio can be enhanced while making the capacitance variable by utilizing the electrostatic force. Further, the variable capacitor according to the present invention can be driven in a movement range which is equivalent to or not less than the conventional movement range within a range of the driving voltage which is smaller than the pull-in voltage.

According to a third aspect of the present invention, there is provided a micro switch comprising the variable capacitor according to the second aspect described above; wherein the first capacitance electrode and the second capacitance electrode are provided so that a capacitance, which is formed by the first capacitance electrode and the second capacitance electrode, forms a capacitance between a high frequency signal-transmitting portion and a ground conductor; and a switching operation is performed for a high frequency signal, flowing through the high frequency signal-transmitting portion, depending on a magnitude of the capacitance formed by the first capacitance electrode the second capacitance electrode.

According to a fourth aspect of the present invention, there is provided a method for driving the micro switch according to the third aspect described above, comprising applying a voltage smaller than a pull-in voltage between the first driving electrode and the second driving electrode in a stationary state that the capacitance, formed by the first capacitance electrode and the second capacitance electrode, is decreased.

According to a fifth aspect of the present invention, there is provided a micro switch comprising: a fixed portion; and a movable portion which is movable with respect to the fixed portion and which is provided to generate a spring force to cause restoration of the movable portion to a predetermined position; wherein the fixed portion has a first driving electrode and a first electric contact; the movable portion has a second driving electrode and a second electric contact; an electrostatic force is generated between the first driving electrode and the second driving electrode by a voltage applied between the first driving electrode and the second driving electrode so that the electrostatic force resists against the spring force; the first driving electrode, the second driving electrode, the first electric contact, and the second electric contact are arranged so that the electrostatic force generated between the first driving electrode and the second driving electrode is generated in a direction in which a spacing distance between the first electric contact and the second electric contact is widened; and a certain spacing distance is provided between the first electric contact and the second electric contact in a state that the electrostatic force generated between the first driving electrode and the second driving electrode has a predetermined magnitude, and the first electric contact and the second electric contact are in contact with each other in a state that the electrostatic force is not generated between the first driving electrode and the second driving electrode.

According to a sixth aspect of the present invention, there is provided a method for driving the micro switch according to the fifth aspect described above, the method comprising applying a voltage smaller than a pull-in voltage between the first driving electrode and the second driving electrode in a stationary state that the spacing distance is provided between the first electric contact and the second electric contact.

According to the present invention as defined above, it is possible to provide the micro switch which makes it possible to decrease the driving voltage without causing any special inconvenience or problem which would be otherwise caused such that the signal pass characteristic is sacrificed and/or the reliability is sacrificed even when the electrostatic driving system is adopted, and to provide the method for driving the micro switch. Further, the driving operation can be performed in a movement range which is equivalent to or not less than the conventional movement range within a range of the driving voltage which is smaller than the pull-in voltage.

According to a seventh aspect of the present invention, there is provided an MEMS type electronic element comprising: a substrate; a fixed plate which is arranged on the substrate so that the fixed plate is separated from the substrate by a predetermined spacing distance and which has a first signal electrode; a movable portion which has a second signal electrode; a plurality of plate spring portions which support the movable portion, with respect to the substrate, from an opposite side opposite to the second signal electrode so that the movable portion is positioned between the substrate and the fixed plate and that the first signal electrode and the second signal electrode are faced with each other; a plurality of second driving electrodes which are arranged in the plate spring portions respectively; and first driving electrodes which are arranged on the substrate at positions corresponding to the second driving electrodes respectively; wherein the plate spring portions are formed by stacking films of not less than two layers; and the movable portion and the plurality of plate spring portions supporting the movable portion from the opposite side are curved as a whole to protrude from the substrate toward the fixed plate.

In the MEMS type electronic element according to the present invention, the plate spring portions may have an upper thin film which is formed as a film so that a tensile stress remains on an upper side of the second driving electrodes, and a lower thin film which is formed as a film so that a compressive stress remains on a lower side of the second driving electrodes; and the plate spring portions may be curved to protrude from the substrate toward the fixed plate by a stress generated by the tensile stress and the compressive stress.

In the MEMS type electronic element according to the present invention, the fixed plate may be arranged at a height at which the fixed plate pushes and lowers the movable portion, curved to protrude from the substrate toward the fixed plate, toward the substrate.

The MEMS type electronic element according to the present invention as described above can be driven in a movement range which is equivalent to or not less than the conventional movement range within a range of the driving voltage which is smaller than the pull-in voltage.

BRIEF DESCRIPTION OF THE DRAWINGS

FIG. 4 shows a schematic sectional view taken along a line Y3-Y4 shown in FIG. 1.

FIGS. 6A and 6B show steps continued from FIG. 5.

FIGS. 7A and 7B show steps continued from FIG. 6.

FIGS. 8A and 8B show steps continued from FIG. 7.

FIGS. 9A and 9B show steps continued from FIG. 8.

FIGS. 10A and 10B show steps continued from FIG. 9.

FIGS. 11A and 11B show steps continued from FIG. 10.

FIGS. 12A and 12B show steps continued from FIG. 11.

FIG. 19 shows an electric circuit of the micro switch shown in FIG. 14 focusing attention on a high frequency signal.

FIGS. 23A and 23B show steps continued from FIG. 22.

FIGS. 29A and 29B show steps continued from FIG. 28.

DESCRIPTION OF THE PREFERRED EMBODIMENTS OF THE INVENTION

Preferred embodiments to carry out the present invention will be explained below with reference to the drawings. The present invention is not limited to the embodiments explained below. In the first embodiment, an explanation will be made about an embodiment of the variable capacitor as an example of the electronic element and the MEMS type electronic element. In the second embodiment, an explanation will be made about a serial type micro switch of the opening/closing system. In the third embodiment, an explanation will be made about a parallel type micro switch (for the high frequency) which is a variable capacitor connected in parallel to a signal line.

First Embodiment

Figure 1:
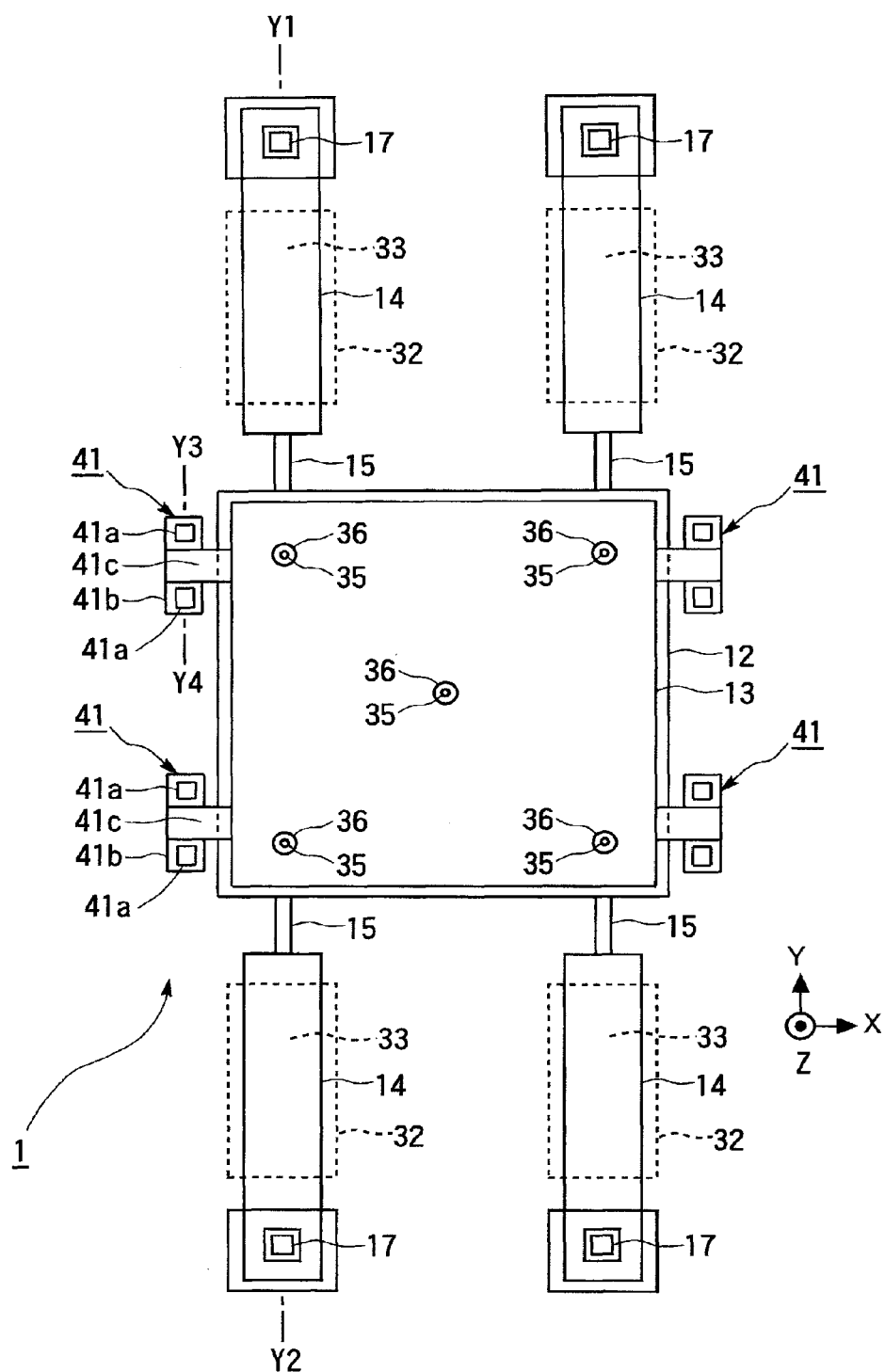
FIG. 1 shows a schematic plan view of a general construction of a variable capacitor according to a first embodiment of the present invention.
Figure 2:
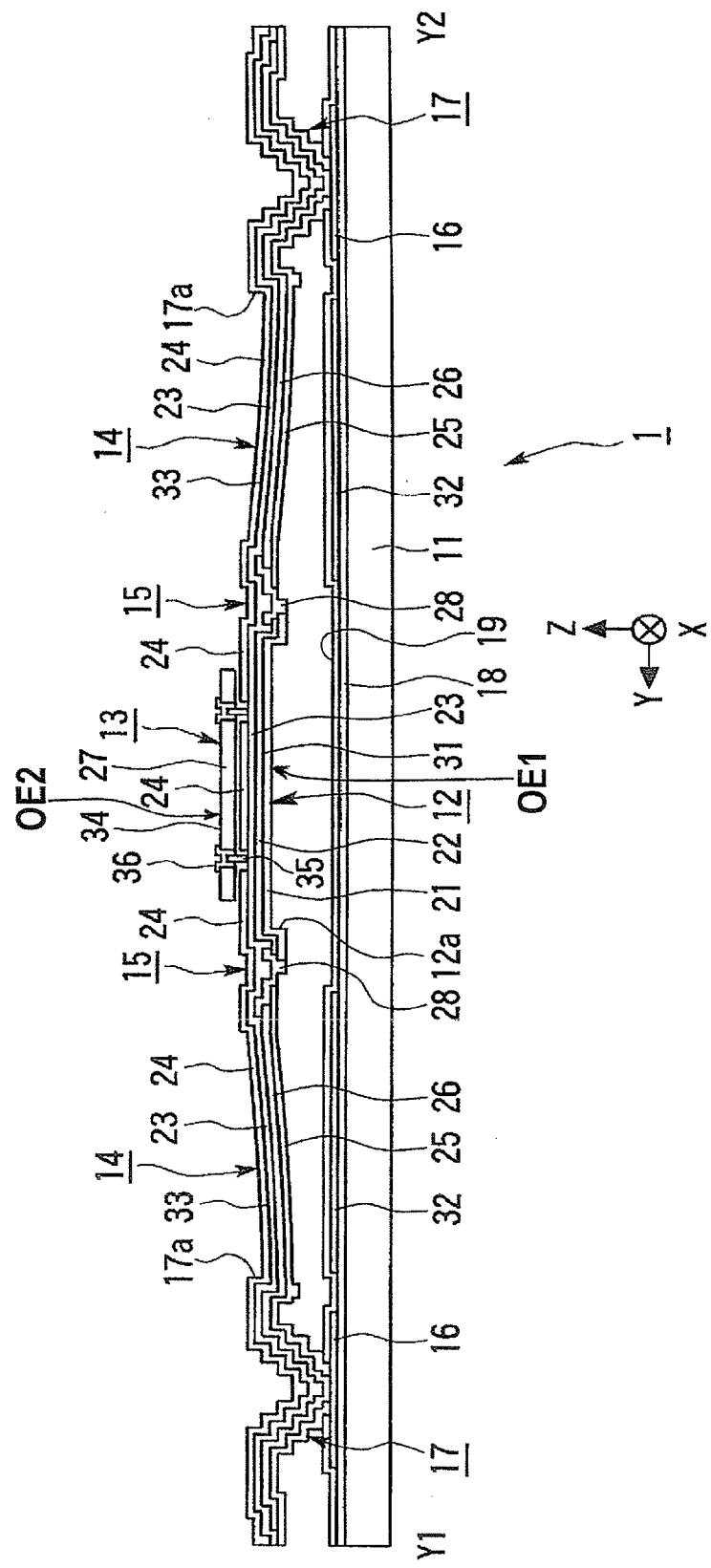
FIG. 2 shows a schematic sectional view taken along a line Y1-Y2 shown in FIG. 1 in a state that no electrostatic force is generated between driving electrodes.
Figure 3:
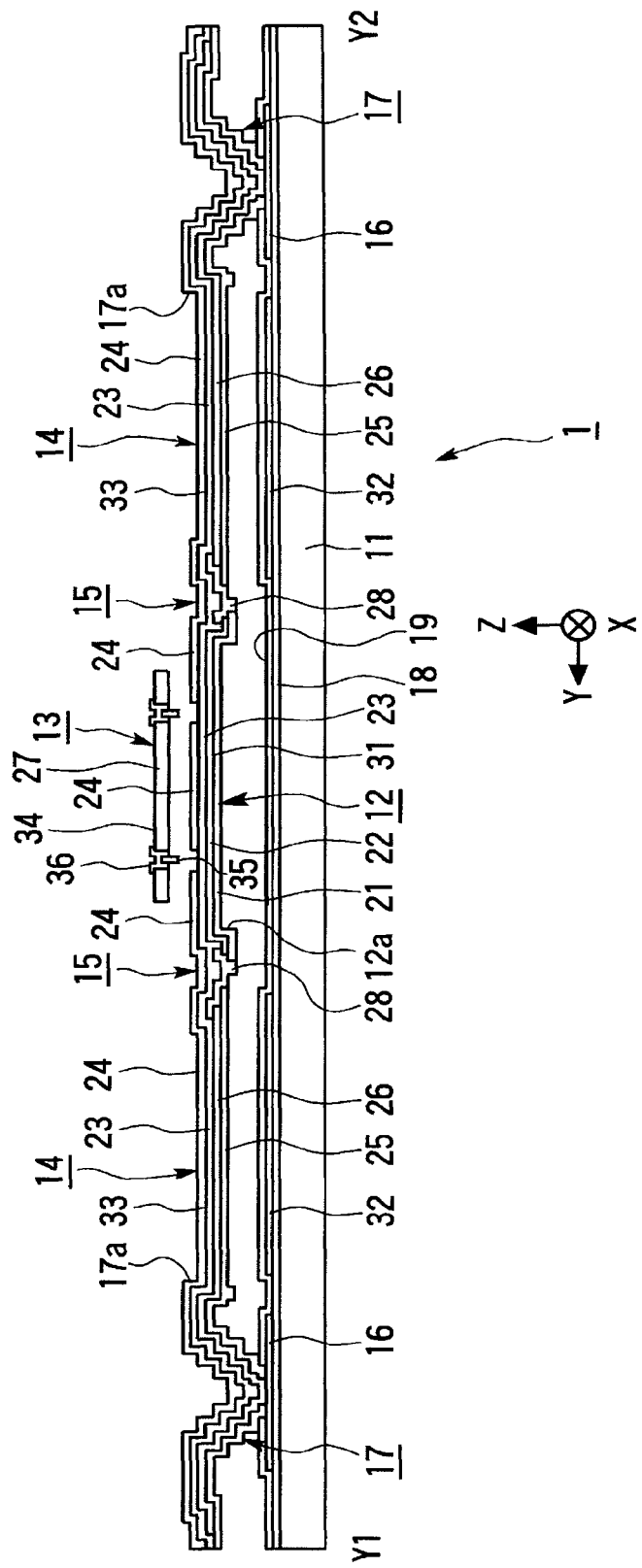
FIG. 3 shows a schematic sectional view taken along the line Y1-Y2 shown in FIG. 1 in a state that the electrostatic force is generated between the driving electrodes.

FIG. 1 shows a schematic plan view of a general construction of a variable capacitor 1 according to the first embodiment of the present invention. FIGS. 2 and 3 each show a schematic sectional view taken along a line Y1-Y2 shown in FIG. 1. FIG. 2 shows a state that no electrostatic force is generated between driving electrodes 32, 33. FIG. 3 shows a state that the electrostatic force is generated between the driving electrodes 32, 33. FIG. 4 shows a schematic sectional view taken along a line Y3-Y4 shown in FIG. 1.

For the convenience of the explanation, X axis, Y axis, and Z axis, which are perpendicular to one another, are defined as shown in FIGS. 1 to 4. The surface of a substrate 11 of the variable capacitor 1 is parallel to the XY plane. A direction in relation to the Z direction, which is directed as depicted by the arrow, is referred to as "+Z direction" or "+Z side", and a direction, which is opposite to the direction of the arrow, is referred to as "−Z direction" or "−Z side". The definition is made in the same manner as described above in relation to the X direction and the Y direction as well. The + side in the Z direction is sometimes referred to as "upper side", and the −side in the Z direction is sometimes referred to as "lower side".

The materials and the like explained below are described by way of example, and the present invention is not limited to the materials and the like.

The variable capacitor 1 according to the first embodiment includes the substrate 11 such as a silicon substrate, a movable plate (driven portion) 12 which is arranged over or above the substrate 11, and a fixed plate 13 which is arranged over or above the movable plate 12 to be opposite or to face the movable plate 12. In addition to the movable plate 12 and the fixed plate 13, the constitutive components, which are different from the substrate 11, as will be described later on are each constructed of a thin film. The length of the substrate 11 is about 0.5 mm to 2.0 mm in a range depicted in FIG. 2. The substrate 11 may be formed to be greater than the range depicted in FIG. 2, and unillustrated other electronic elements (for example, transistor, resistor element, coil element, etc.) may be formed at portions other than the portion depicted in FIG. 2.

In the first embodiment, the movable plate 12 is supported displaceably on the fixed plate (the substrate 11) by four strip-shaped plate spring portions 14. One end of each of the plate spring portions 14 is connected to the movable plate 12 via a connecting portion 15. As shown in FIG. 1, the connecting portion 15 is constructed to have a width which is narrower (smaller) than that of the plate spring portion 14. Further, the connecting portion 15 is formed of a single layer Al film 23 as described later on. Therefore, the connecting portion 15 is more flexible or bent more easily than portions other than the connecting portion 15. Therefore, the connecting portion 15 has a mechanical degree of freedom to some extent. The other end of each of the plate spring portions 14 is fixed to the substrate 11 by a leg (anchor portion) 17. The leg 17 has a rising portion which rises from the substrate 11 via a wiring pattern 16 (not shown in FIG. 1) constructed of an Al film formed on the substrate 11. The wiring pattern 16 is formed between an SiN film (silicon oxide film) 18 which is disposed on the lower side and which functions as an insulating film formed on the substrate 11, and an SiN film 19 which is disposed on the upper side and which functions as a protective film.

Each of the plate spring portions 14 is curved upwardly (in the +Z direction) as shown in FIG. 2 when the electrostatic force is not generated between the driving electrodes 32, 33 as described later on. In the first embodiment, the movable plate 12, the plate spring portions 14, and the connecting portions 15 are provided so that they are movable (displaceable) in the upward-downward direction with respect to the fixed portion such as the substrate 11, and that the spring force is generated to realize restoration to the upper position as shown in FIG. 2, and the movable plate 12, the plate spring portions 14, and the connecting portions 15 constitute the movable portion. Two pairs of the plate spring portions 14, the connecting portions 15, and the legs 17 are arranged as shown in FIG. 1 with respect to the movable plate 12 (arranged on the both sides in the Y direction). That is, the two plate spring portions 14, which are included in each of the pairs, support the movable plate 12 on the both sides in the Y direction. Accordingly, the uniform spring forces are generated on the both sides of the movable plate 12. Therefore, the movable plate 12 is capable of making the movement upwardly and downwardly while maintaining the parallel state with respect to the substrate 11. The components (for example, the substrate 11 and the fixed plate 13) other than the movable plate 12, the plate spring portions 14, and the connecting portions 15 constitute the fixed portion.

As shown in FIGS. 2 and 3, the movable plate 12 is constructed such that an SiN film 21, an Al film 22, an Al film 23, and an SiN film 24 are stacked in this order from the lower side. The SiN film 24, which is disposed on the upper side, has openings at positions corresponding to projections 35 as described later on. In the first embodiment, the Al films 22, 23 of the movable plate 12 constitute a movable side capacitance electrode (second capacitance electrode) 31. As shown in FIGS. 2 and 3, a step 12a is formed in order to effect the reinforcement in the vicinity of the circumference of the movable plate 12 (outer circumferential portion). The step 12a is formed over the entire circumference of the outer circumferential portion of the movable plate 12 (movable electrode) which is substantially square. Therefore, the movable plate 12 is hardly deformed by the internal stress of itself, and the movable plate 12 is hardly curved or warped by the spring force, and thus the movable plate 12 can maintain the substantially planar state even in such a situation that the strong spring force is generated.

As shown in FIGS. 2 and 3, the connecting portion 15, which is connected to the movable plate 12 at the outside of the step 12a, has such a structure that an SiN film 28, the Al film 23, and the SiN film 24 are stacked in this order from the lower side. The Al film 23 and the SiN film 24 extend continuously as they are from the movable plate 12. The metal film of the connecting portion 15 is one layer of the Al film 23. The Al film 23 in the connecting portion 15 is easily bent than the two layers of the Al films 23, 22 in the movable plate 14 (23, 26 in the plate spring portion 14 described below).

The plate spring portion 14, which is connected to the movable plate 12 via the connecting portion 15, has such a structure that an SiN film 25, an Al film 26, the Al film 23, and the SiN film 24 are stacked in this order from the lower side. The Al film 23 and the SiN film 24 extend continuously as they are from the connecting portion 15. The plate spring portion 14 is curved upwardly (in the +Z direction) as shown in FIG. 2 by the internal stresses of the films 25, 26, 23, 24 in a state that no electrostatic force is generated between the driving electrodes 32, 33 as described later on. The Al films 23, 26 of the plate spring portion 14, especially the Al films 23, 26 disposed in an area, of the plate spring portion 14, opposite to the fixed side driving electrode 32, are the movable side driving electrode (second driving electrode) 33.

The internal stresses of the films 25, 26, 23, 24 may be provided, for example, such that the film 25, which is included in the two SiN films 24, 25 stacked in the plate spring portion 14 and which is disposed on the lower side of (at a position below) the metal films 26, 23, is formed to allow the compressive stress to remain, and that the film 24, which is disposed on the upper side of (at a position above) the metal films 26, 23, is formed to allow the tensile stress to remain. The stresses of the two SiN films 24, 25 can be changed, for example, by changing the gas component ratio and/or the electric power during the film formation. In this exemplary embodiment, the two films 24, 25 are formed of SiN. However, the two films 24 and 25 may be formed of mutually different materials (for example, $SiO_2$ and SiN). Accordingly, the plate spring portion 14 is curved or warped upwardly when a sacrifice layer is removed as described later on. Other than the above, for example, the plate spring portion 14 may be curved or warped upwardly by forming three or more layers of the Al films in the plate spring portion 14. Further, other than the above, for example, the plate spring portion 14 may be curved or warped upwardly by allowing the film formation area or areal size of the lower film 25 and the film formation area or areal size of the upper film 24 to differ.

The other end of the plate spring portion 14 is connected to the leg 17. The leg 17 has such a structure that the SiN film 25, the Al film 26, the Al film 23, and the SiN film 24 are stacked in this order from the lower side. As for the SiN film 25, the Al film 26, the Al film 23, and the SiN film 24, those which construct the plate spring portion 14 extend continuously as they are. The SiN film 25 has an opening at a portion at which the film 25 makes contact with the substrate 11. The Al film 26 is electrically connected to the wiring pattern 16 of the substrate 11 via the opening. As shown in FIGS. 2 and 3, a step 17a is formed to effect the reinforcement on the outer circumferential surface of the rising portion of the leg 17.

The fixed side driving electrode (first driving electrode) 32, which is constructed of the Al film, is formed in an area opposite to the plate spring portion 14 and under or below the plate spring portion 14 which functions as the movable side driving electrode (second driving electrode) 33. The fixed side driving electrode 32 is formed between the SiN films 18, 19 on the substrate 11. The Al films 23, 26 of the plate spring portion 14, especially the Al films 23, 26 located in an area, of the plate spring portion 14, opposite to or facing the fixed side driving electrode 32 constitute the movable side driving electrode (second driving electrode) 33. When the voltage is applied between the driving electrodes 32, 33, the electrostatic force is generated between the driving electrodes 32, 33. As shown in FIG. 3, the movable portion (plate spring portion 14, connecting portion 15, and movable plate 12) is moved downwardly, and the movable portion is stopped at a position at which the electrostatic force and the spring force brought about by the plate spring portion 14 are balanced with each other.

As clarified from the foregoing explanation, in the first embodiment, the movable side capacitance electrode 31 and the movable side driving electrode 33 are electrically connected mutually commonly, and are connected to the same wiring pattern 16 of the substrate 11 at the leg 17. However, the both electrodes 31, 33 may be electrically separated from each other. For example, a conductor film, which is provided to connect the movable side capacitance electrode 31 to the wiring pattern 16 of the substrate 11, may be formed for the plate spring portion 14 distinctly (separately) from the movable side driving electrode 33. The distinct conductor film may be electrically connected to any wiring pattern 16 different from the movable side driving electrode 33, to thereby making it possible to electrically separate the both electrodes 31, 33.

As shown in FIGS. 1 to 3, the fixed plate 13 is arranged over or above the movable plate 12 to be opposite to or to face the movable plate 12. As shown in FIGS. 1 and 4, the fixed plate 13 is fixed to the substrate 11 by four support portions 41 so that the fixed plate 13 is not moved with respect to the substrate 11. The fixed plate 13 is basically constructed of an Al film 27. The Al film 27 functions as the fixed side capacitance electrode (first capacitance electrode) 34. The fixed plate 13 has the projections 35. The projection 35 is composed of Al, and the projection 35 protrudes downwardly from the lower surface of the fixed plate 13. Projection-holding members 36, each of which is constructed of an SiN film to effect the electrical insulation for the projections 35 and the Al film 27, are arranged between the projections 35 and the Al film 27 (fixed side capacitance electrode 34). As shown in FIG. 2, the movable plate 12, which is curved or warped upwardly by the spring force, abuts against the projections 35 in the state of being not driven. The spacing distance between the movable side capacitance electrode 31 and the fixed side capacitance electrode 34 is minimized (smallest) in the abutment state. The contact area or areal size between the fixed plate 13 and the movable plate 12 is made to be small by the projections 35. Therefore, it is possible to reduce the fear of the occurrence of the phenomenon called "sticking" in which the movable plate 12 is stuck to the fixed plate 13 and the movable plate 12 is not separated therefrom. However, in the present invention, it is not necessarily indispensable to provide the projections 35. The projections 35 as described above may be provided on the side of the movable plate 12.

Each of the support portions 41, which supports the fixed plate 13 at the position separated (away) from the substrate 11, has two legs (anchors) 41a, a support portion-body 41b, and a connecting portion 41c. The leg (anchor) 41a has a rising portion which rises from the substrate 11 via a wiring pattern 20 (not shown in FIG. 1) constructed of an Al film formed on the substrate 11. The support portion-body 41b is fixed to the substrate 11 by the legs 41a. The connecting portion 41c connects the support portion-body 41b and the fixed plate 13. The wiring pattern 20 is formed between the SiN films 18, 19 formed on the substrate 11.

As shown in FIG. 4, the connecting portion 41c is constructed such that the Al film 27, which constitutes the fixed side capacitance electrode 34 of the fixed plate 13, extends continuously as it is. The support portion-body 41b has such a structure that an SiN film 51, an Al film 52, an Al film 53, an SiN film 54, and the Al film 27 are stacked in this order from the lower side. The Al film 27 extends continuously from the connecting portion 41c as it is. A gap 91 is provided between the SiN film 54 and the Al film 27.

Each of the legs 41a is constructed such that the SiN film 51, the Al film 52, the Al film 53, and the Al film 27, which constitute the support portion-body 41b, extend continuously as they are. The Al film 51 is electrically connected to the wiring pattern 20 via an opening formed through the SiN film 51 at the leg 41a. The Al film 27 is electrically connected to the Al film 52 via an opening formed through the SiN film 54 at the leg 41a. A step, which is provided in order to effect the reinforcement, is formed in the vicinity of the circumference at which the leg 41a is allowed to rise. Accordingly, the fixed side capacitance electrode 34 is electrically connected to the wiring pattern 20 of the substrate 11.

Figure 13:
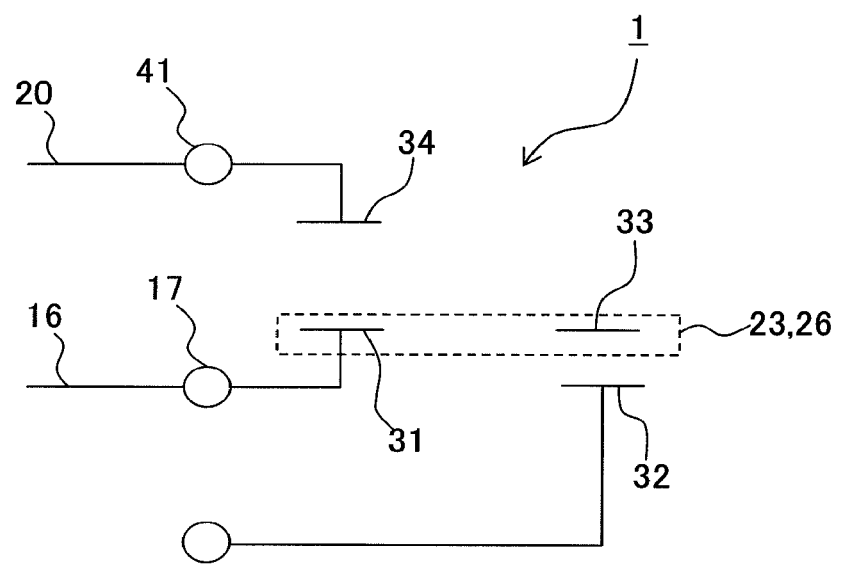
FIG. 13 shows an electric circuit of the variable capacitor shown in FIG. 1.

The capacitance, which is to be used as the output, is formed between the capacitance electrodes 31, 34. Accordingly, the wiring patterns 16, 20, which are connected to the capacitance electrodes 31, 34 respectively, are connected to a high frequency circuit, etc. The electric circuit of the variable capacitor 1 according to the first embodiment is shown in FIG. 13. As shown in FIG. 13, the position of the movable side capacitance electrode 31 is changed by the DC-like voltage (for example, the DC voltage, the DC component of the voltage, etc.) applied between the driving electrodes 32, 33 in the variable capacitor 1 according to the first embodiment. The capacitance between the capacitance electrodes 31, 34 is changed in accordance with the change of the position. Accordingly, the capacitance is changed between the wiring pattern 20 connected to the support portion 41 and the wiring pattern 16 connected to the leg (anchor portion) 17. Specifically, in the state that the driving voltage is not applied between the driving electrodes 32, 33, as shown in FIG. 2, the capacitance electrode 31 abuts against the projections 35, the spacing distance between the capacitance electrodes 31, 34 is minimized (smallest), and the capacitance of the variable capacitor 1 formed between the support portion 41 (see FIG. 1) and the leg (anchor portion) 17 (i.e., between the wiring pattern 16 and the wiring pattern 20) is maximized (greatest). When a predetermined DC-like voltage is applied between the driving electrodes 32, 33, then as shown in FIG. 3, the spacing distance between the capacitance electrodes 31, 34 is widened against the spring force, and the capacitance of the variable capacitor 1, which is formed between the support portion 41 and the leg (anchor portion) 17 (i.e., between the wiring pattern 16 and the wiring pattern 20), is decreased. In the state shown in FIG. 3, the movement distance between the driving electrodes 32, 33 is within a range to ⅓ from the initial position. Therefore, the so-called pull-in phenomenon is not caused in the movement state.

In the first embodiment, when the electrostatic force is not generated between the driving electrodes 32, 33, the movable plate 12 abuts against the projections 35 of the fixed plate 13 as shown in FIG. 2. Further, the stress, etc. of the plate spring portion 14 is designed so that the force, with which the movable plate 12 is pressed against the projections 35 by the spring force of the plate spring portion 14 in this situation, is sufficiently small. In the first embodiment, the design is made such that the spacing distance between the capacitance electrodes 31, 34 is sufficiently small in the state shown in FIG. 2. This spacing distance is narrower than at least the spacing distance between the driving electrodes 32, 33 (average spacing distance in the first embodiment). In order to enhance the variable capacitance ratio, it is preferable that the spacing distance between the capacitance electrodes 31, 34 is made to be narrow as much as possible in the state that the electrostatic force is not generated between the driving electrodes 32, 33.

Next, an explanation will be made briefly with reference to FIGS. 5 to 12 about an exemplary method for producing the variable capacitor 1 according to the first embodiment. FIGS. 5 to 12 are schematic sectional views each illustrating respective steps of the production method, and approximately correspond to the left half portions of FIGS. 2 and 3. This production method is a method for producing MEMS in accordance with a semiconductor process.

Figure 5A:
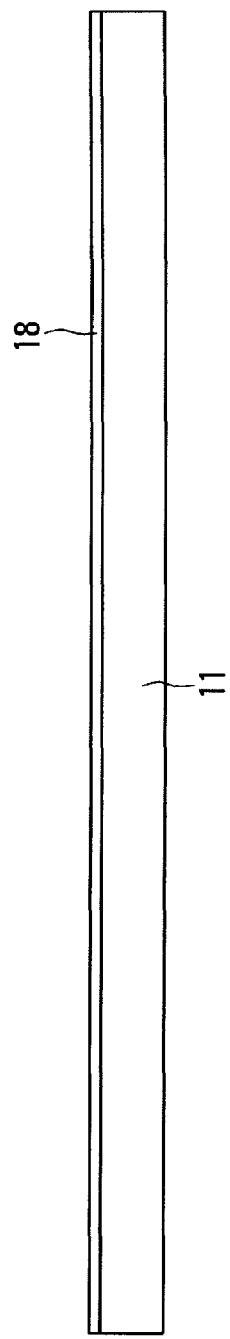
FIGS. 5A and 5B show steps of a method for producing the variable capacitor shown in FIG. 1.
Figure 5B:
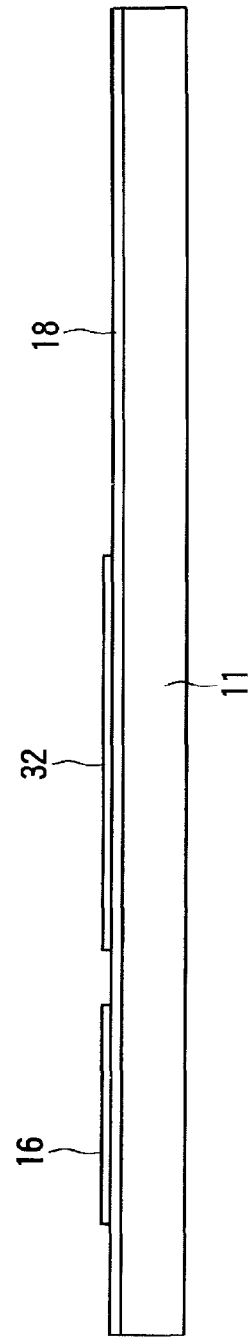

At first, the SiN film 18 is formed as a film by the thermal oxidation on the upper surface of the silicon substrate 11. An Al film is deposited on the SiN film 18 by the vapor deposition, the sputtering method or the like (FIG. 5A). After that, the Al film is patterned by the photolitho-etching method to provide the shapes of the fixed side driving electrodes 32, the wiring patterns 16, 20, and the other wiring patterns (FIG. 5B).

Subsequently, an SiN film is deposited by the plasma CVD method or the like on the substrate in the state shown in FIG. 5B. A predetermined photolitho-etching step is performed to pattern the SiN film to provide the shape of the SiN film 19 described above (FIG. 6A). After that, photoresists 101, 102, which serve as sacrifice layers, are coated, and a predetermined photolitho-etching step is performed for the photoresists 101, 102 (FIG. 6B).

Subsequently, a photoresist 103, which serves as a sacrifice layer in order to form the reinforcing step, is coated. A predetermined photolitho-etching step is applied to the photoresist 103 (FIG. 7A).

After that, an SiN film is deposited, by the plasma CVD method or the like, on the substrate in the state shown in FIG. 7A. A predetermined photolitho-etching step is performed to pattern the SiN film into the shapes of the SiN films 21, 25, 51 described above (FIG. 7B).

Subsequently, an Al film is formed as a film by the sputtering or the like on the substrate in the state shown in FIG. 7B. The Al film is patterned into the shapes of the Al films 22, 26, 52 described above (FIG. 8A).

Subsequently, an SiN film is deposited, by the plasma CVD method or the like, on the substrate in the state shown in FIG. 8A. A predetermined photolitho-etching step is performed to pattern the SiN film into the shape of the SiN film 28 disposed on the lower side of the connecting portion 15 (FIG. 8B).

Subsequently, an Al film is formed as a film by the sputtering or the like on the substrate in the state shown in FIG. 8B. The Al film is patterned into the shapes of the Al films 23, 53 described above (FIG. 9A).

After that, an SiN film is deposited by the plasma CVD method or the like on the substrate in the state shown in FIG. 9A. A predetermined photolitho-etching step is performed to pattern the SiN film into the shapes of the SiN films 24, 54 described above (FIG. 9B).

Subsequently, a photoresist 104, which serves as a sacrifice layer, is coated for the purpose of padding or plugging. A predetermined photolitho-etching step is performed for the photoresist 104 (FIG. 10A).

Subsequently, a photoresist 105, which serves as a sacrifice layer, is coated. A predetermined photolitho-etching step is performed for the photoresist 105 (FIG. 10B).

Subsequently, a photoresist 106, which serves as a sacrifice layer in order to form the reinforcing step, is coated. A predetermined photolitho-etching step is applied to the photoresist 106 (FIG. 11A).

After that, an Al film is formed as a film by the sputtering or the like on the substrate in the state shown in FIG. 11A. The Al film is patterned into the shapes of the Al film 27 and the projections 35 described above (FIG. 11B).

Subsequently, an SiN film is deposited by the plasma CVD method or the like on the substrate in the state shown in FIG. 11B. A predetermined photolitho-etching step is performed to pattern the SiN film into the shapes of the projection-holding members 36 described above (FIG. 12A).

Finally, the photoresists 101 to 106, which are the sacrifice layers, are ashed and removed with the oxygen plasma (FIG. 12B). Accordingly, the variable capacitor 1 according to the first embodiment is completed. When the photoresists 101 to 106 are removed, the plate spring portions 14 are curved upwardly as shown in FIG. 2. However, the plate spring portion 14 is depicted in a non-curved state in FIG. 12B such that the production method can be understood easily.

For example, the film formation conditions for the respective films 23 to 26 are determined so that the plate spring portions 14 are curved upwardly as shown in FIG. 2 in accordance with the internal stresses of the films 23 to 26 after removing the photoresists 101 to 106. For example, as described above, the following procedure is appropriately adopted. That is, the film 25, which is disposed on the lower side of the metal films 26, 23 and which is included in the two SiN films 24, 25 stacked at the plate spring portion 14, is formed so that the compressive stress is allowed to remain. Further, the film 24, which is disposed on the upper side of the metal films 26, 23, is formed so that the tensile stress is allowed to remain. The stresses of the two SiN films 24, 25 can be changed, for example, by changing the gas component ratio and/or the electric power during the film formation. In this embodiment, the two films 24, 25 are formed of SiN. However, the two films 24, 25 may be formed of mutually different materials (for example, $SiO_2$ and SiN). With this, the plate spring portions 14 are curved upwardly when the sacrifice layers are removed as described later on. Other than the above, for example, the plate spring portion 14 may be curved upwardly by forming three or more layers of Al films at the plate spring portion 14. Further, other than the above, for example, the plate spring portion 14 may be curved upwardly by allowing the film formation area or areal size of the lower film 25 and the film formation area or areal size of the upper film 24 to differ.

Although not shown in the drawings, holes for the etching are provided beforehand at appropriate positions in order that the photoresists 101 to 106 can be completely removed. For example, holes for the etching are provided beforehand through the Al film 27 constructing the fixed side capacitance electrode 34 of the fixed plate 13.

The support portions 41 supporting the fixed plate 13 are not shown in FIGS. 5 to 12. However, as appreciated from the foregoing explanation, the support portions 41 are simultaneously formed concurrently with the steps shown in FIGS. 5 to 12.

In the first embodiment, as appreciated from the foregoing explanation, the driving electrodes 32, 33 and the capacitance electrodes 31, 34 are provided distinctly from each other. In the first embodiment, the fixed side driving electrodes 32 are arranged at relatively lower positions and the movable side driving electrodes 33 are arranged at relatively upper positions, while the fixed side capacitance electrode 34 is arranged at a relatively upper position and the movable side capacitance electrode 31 is arranged at a relatively lower position. The vertical positional relationship between the fixed side 32 and the movable side 33 concerning the driving electrodes is opposite to the vertical positional relationship between the fixed side 34 and the movable side 31 concerning the capacitance electrodes. Accordingly, in the first embodiment, the electrostatic forces, which are generated between the driving electrodes 32, 33, are generated in the direction in which the spacing distance between the movable electrodes 31, 34 is widened.

Therefore, in the first embodiment, as shown in FIG. 2, the spacing distance between the capacitance electrodes 31, 34 is minimized, and the capacitance brought about by the capacitance electrodes 31, 34 is maximized in the state that the voltage is not applied between the driving electrodes 32, 33 and hence the electrostatic force is not generated between the driving electrodes 32, 33. When the voltage between the driving electrodes 32, 33 is increased, the spring force and the electrostatic force generated between the driving electrodes 32, 33 are stably balanced with each other until the spacing distance between the driving electrodes 32, 33 arrives at the spacing distance of about ⅓ of the initial spacing distance from the initial spacing distance. Therefore, as shown in FIG. 3, the movable side driving electrode 33 is stably stopped at the spacing distance between the electrodes 32, 33 which is narrowed in accordance with the applied voltage, thereby causing the movable side capacitance electrode 31 to stably stop at the spacing distance between the electrodes 31, 34 which is widened in accordance with the magnitude of the applied voltage.

The range, in which the spacing distance between the driving electrodes 32, 33 is continuously adjustable (i.e., the range in which the spacing distance is changed in correlation to the magnitude of the driving voltage), is limited to the range from the initial spacing distance (maximum spacing distance) to the spacing distance of about ⅓ of the initial spacing distance (i.e., the range from about 0.67 to 1 provided that the initial spacing distance is 1), due to the so-called pull-in phenomenon. However, in the first embodiment, the spacing distance can be continuously adjusted within the range from the spacing distance at which the spacing distance between the capacitance electrodes 31, 34 is minimized to the spacing distance at which the spacing distance between the capacitance electrodes 31, 34 is widened to some extent. Further, the movable plate 12 and the two pairs of the plate spring portions 14 are curved to protrude upwardly as a whole. Therefore, the distance from the movable plate 12 to the substrate 11, i.e., the movable range of the movable plate 12 is secured, for example, from 8 to 5 micrometers. The range, in which the spacing distance between the driving electrodes 32, 33 can be continuously adjusted, is remarkably widened as compared with any conventional movable range which is formed by the removal of the sacrifice layer.

Therefore, according to the first embodiment, the spacing distance between the capacitance electrodes 31, 34 can be allowed to approach zero without being restricted by the pull-in phenomenon, provided that the minimum (smallest) spacing distance between the capacitance electrodes 31, 34 (i.e., the spacing distance between the capacitance electrodes 31, 34 brought about in such a situation that the electrostatic force is not generated between the driving electrodes 32, 33 because the voltage is not applied between the driving electrodes 32, 33) is sufficiently narrowed. Further, the capacitance between the capacitance electrodes 31, 34 can be continuously adjusted in the range near to zero. Therefore, the variable capacitance ratio is raised as compared with the variable capacitor disclosed in "A micromachined variable capacitor for monolithic low-noise VCOs" described above. Further, an equivalent capacitance can be obtained with a smaller area or areal size as compared with the variable capacitor disclosed in "A micromachined variable capacitor for monolithic low-noise VCOs" described above. The capacitance can be greatly changed with the equivalent capacitance as a reference. It is possible to obtain the high performance variable capacitor.

If necessary, an initial bias voltage may be applied between the driving electrodes 32, 33 to adjust the initial spacing distance between the capacitance electrodes 31, 34.

The first embodiment of the present invention has been explained above. However, the present invention is not limited to the first embodiment.

For example, the film structures or constructions of the respective portions (for example, the number of layers and the materials) are not limited to those described in the foregoing embodiment.

It is allowable that, different from the first embodiment, the fixed side driving electrodes 32 are arranged at relatively upper positions and the movable side driving electrodes 33 are arranged at relatively lower positions, while the fixed side capacitance electrode 34 is arranged at a relatively lower position and the movable side capacitance electrode 31 is arranged at a relatively upper position. In this modification, the electrostatic force, which is generated between the driving electrodes 32, 33, is generated in the direction in which the spacing distance between the movable electrodes 31, 34 is widened.

In the first embodiment described above, the movable side capacitance electrode 31 abuts against the projections 35 provided on the fixed side capacitance electrode 34 and the movable plate 12 is slightly pushed and lowered downwardly by the fixed plate 13 in the initial state that the driving voltage is not applied. Accordingly, the initial spring force is generated in the initial state that the driving voltage is not applied. Other than the above, for example, the movable side capacitance electrode 31 may be at a position separated from the projections 35 in the initial state that the driving voltage is not applied. However, when the movable side capacitance electrode 31 is separated from the projections 35 in the initial state in such a manner, the initial capacitance value, which is to be obtained in this state, tends to be affected by the fluctuation in the production caused by the stress described above or the like. Therefore, it is appropriate that the movable plate 12 is slightly pushed and lowered downwardly by the fixed plate 13 to make the displacement in the initial state, for example, in such a usage that the accuracy is important for the capacitance value in the initial state.

Second Embodiment

Figure 14:
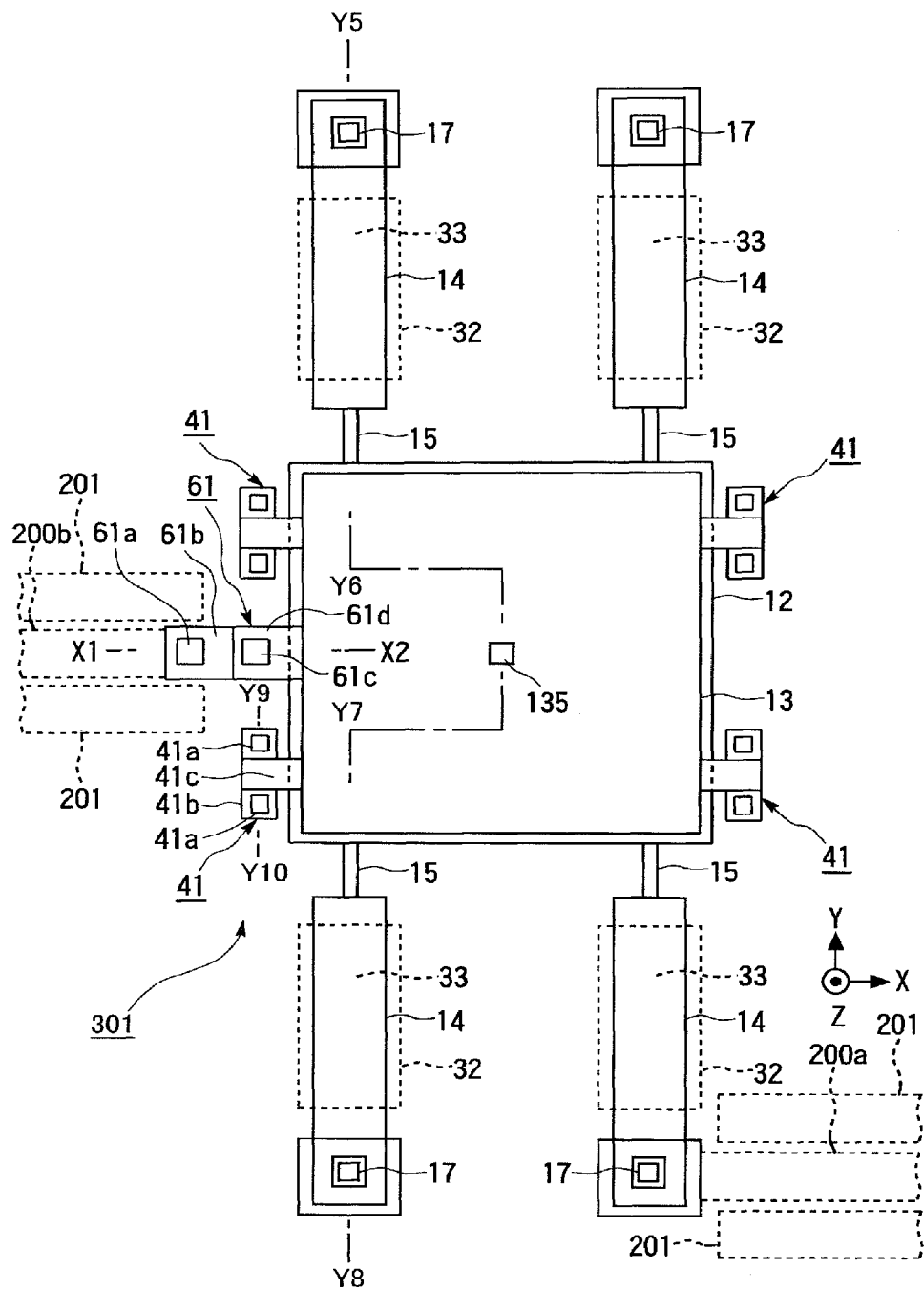
FIG. 14 shows a schematic plan view of a general construction of a micro switch according to a second embodiment of the present invention.
Figure 15:
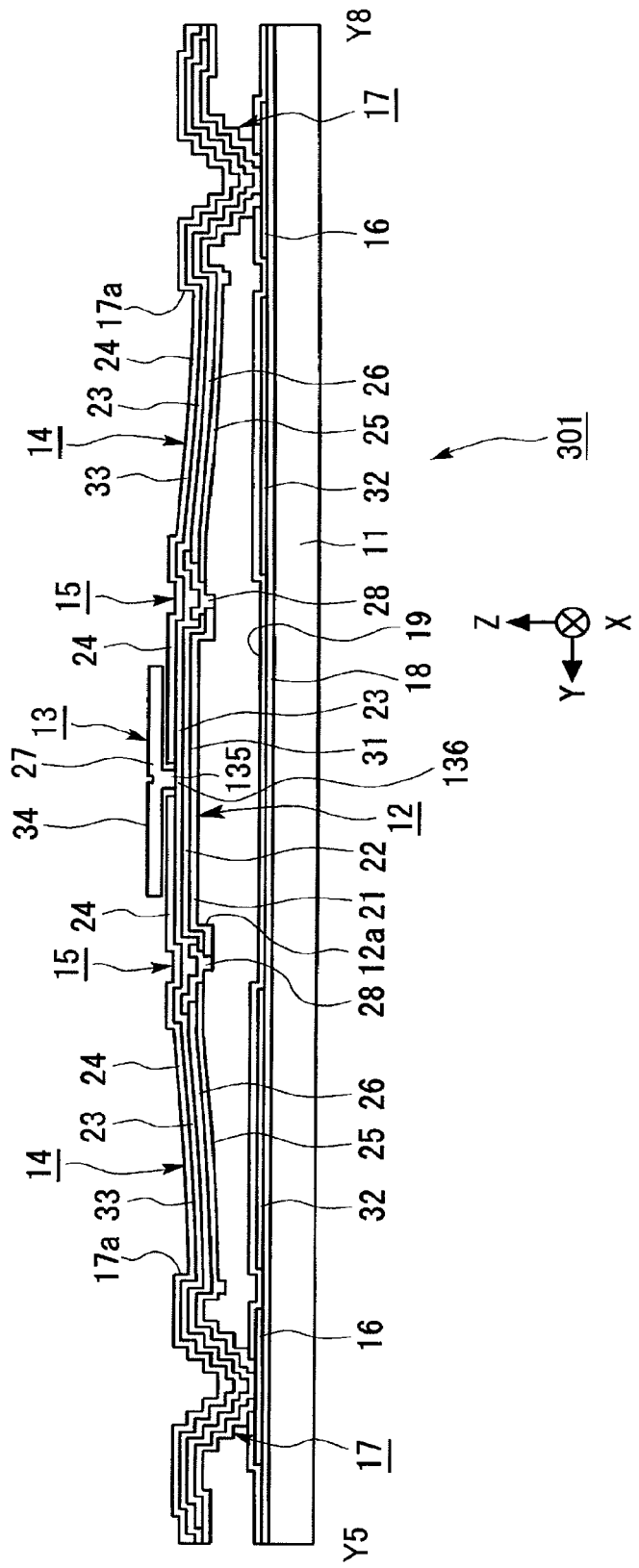
FIG. 15 shows a schematic sectional view taken along a line Y5-Y6-Y7-Y8 shown in FIG. 14 in a state that no electrostatic force is generated between driving electrodes.
Figure 16:
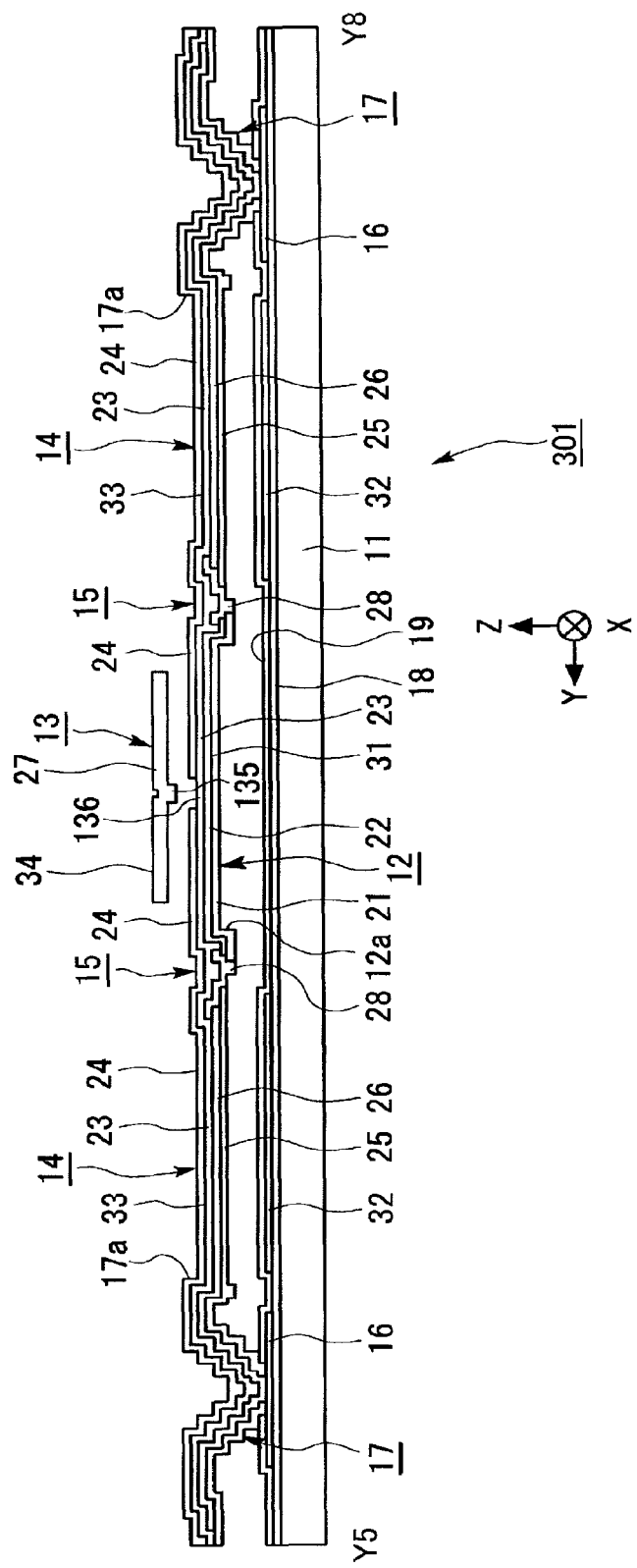
FIG. 16 shows a schematic sectional view taken along the line Y5-Y6-Y7-Y8 shown in FIG. 14 in a state that the electrostatic force is generated between the driving electrodes.
Figure 17:
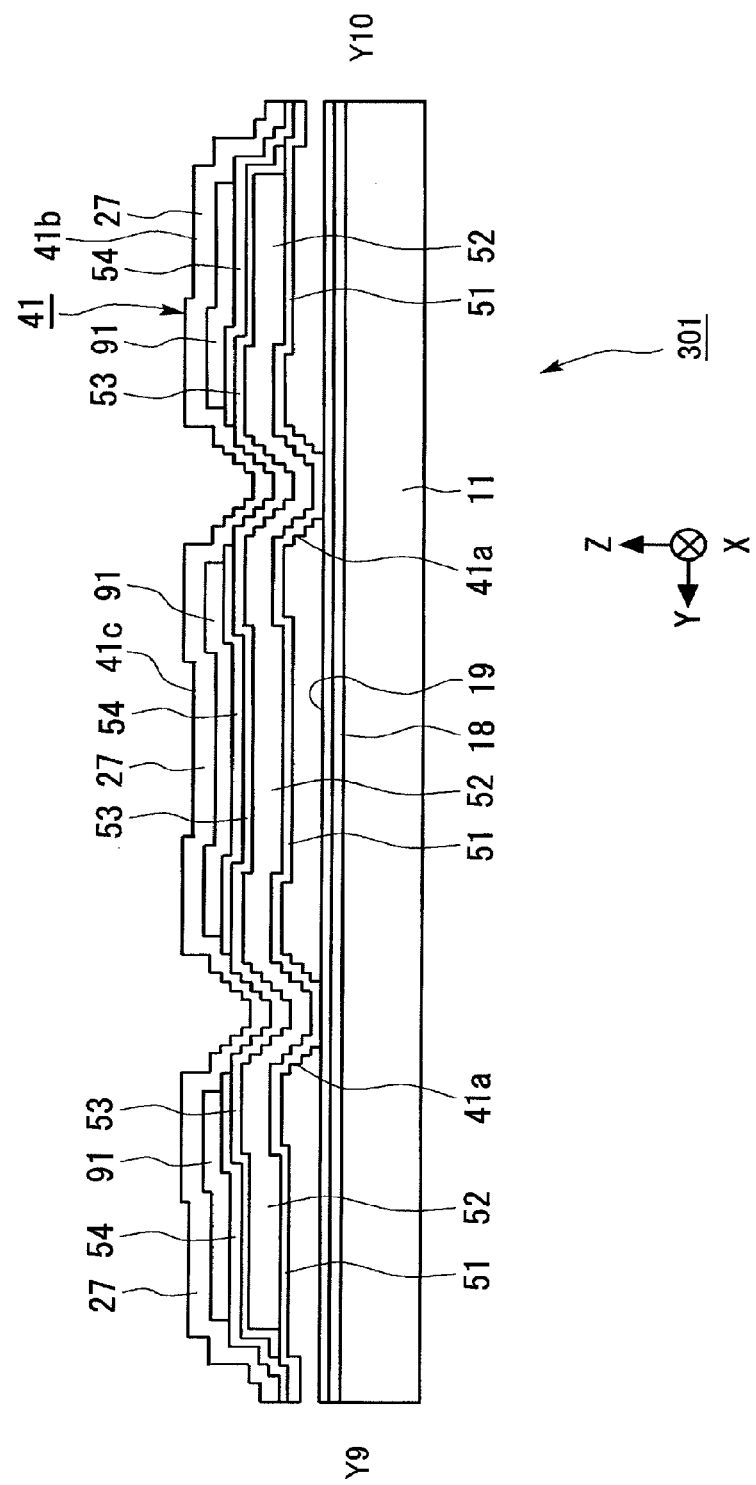
FIG. 17 shows a schematic sectional view taken along a line Y9-Y10 shown in FIG. 14.
Figure 18:
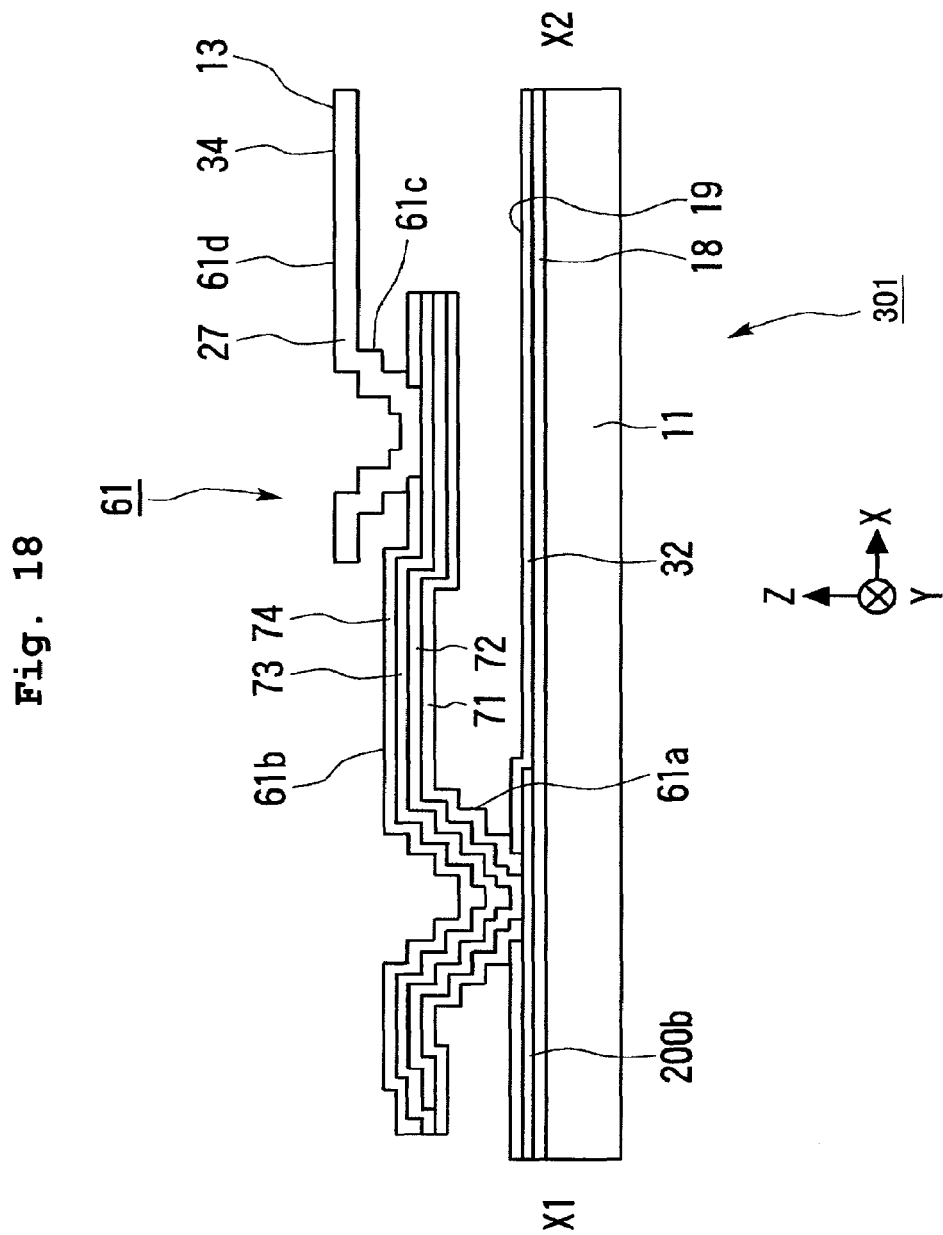
FIG. 18 shows a schematic sectional view taken along a line X1-X2 shown in FIG. 14.

FIG. 14 shows a schematic plan view of a general construction of a micro switch (MEMS switch in this embodiment) 301 according to the second embodiment of the present invention. FIGS. 15 and 16 show schematic sectional views taken along a line Y5-Y6-Y7-Y8 shown in FIG. 14 as viewed from the −X side to the +X side respectively. FIG. 15 shows a state that no electrostatic force is generated between driving electrodes 32, 33. FIG. 16 shows a state that the electrostatic force is generated between the driving electrodes 32, 33. FIG. 17 shows a schematic sectional view taken along a line Y9-Y10 shown in FIG. 14. FIG. 18 shows a schematic sectional view taken along a line X1-X2 shown in FIG. 14.

For the convenience of the explanation, the X axis, the Y axis, and the Z axis, which are perpendicular to one another, are defined as shown in FIGS. 14 to 18. The surface of a substrate 11 of the micro switch 301 is parallel to the XY plane. A direction in relation to the Z direction, which is directed as depicted by an arrow, is referred to as "+Z direction" or "+Z side", and a direction, which is opposite to the direction of the arrow, is referred to as "−Z direction" or "−Z side". The definition is made in the same manner as described above in relation to the X direction and the Y direction as well. The +side in the Z direction is sometimes referred to as "upper side", and the −side in the Z direction is sometimes referred to as "lower side".

The materials and the like explained below are described by way of example, and the present invention is not limited to the materials and the like.

The micro switch 301 according to the second embodiment is constructed as a serial type switch. The micro switch 301 includes the substrate 11 such as a silicon substrate, a movable plate 12 which is arranged over or above the substrate 11, and a fixed plate 13 which is arranged over or above the movable plate 12 to be opposite to or to face the movable plate 12. In addition to the movable plate 12 and the fixed plate 13, constitutive components, which are different from the substrate 11, as described later on are each constructed of a thin film.

In the second embodiment, the movable plate 12 is supported by four strip-shaped plate spring portions 14. One end of each of the plate spring portions 14 is connected to the movable plate 12 via a connecting portion 15. As shown in FIG. 14, the connecting portion 15 is constructed to have a width which is narrower than that of the plate spring portion 14. Further, the connecting portion 15 has one layer of an Al film 23 as described later on. Owing to this structure, the connecting portion 15 is more flexible or bent more easily as compared with portions other than the connecting portion 15. Further, the connecting portion 15 has a mechanical degree of freedom to some extent. The other end of each of the plate spring portions 14 is fixed to the substrate 11 by a leg (anchor portion) 17. The leg 17 (anchor portion) has a rising portion which rises from the substrate 11 via a wiring pattern 16 (not shown in FIG. 14) constructed of an Al film formed on the substrate 11. The wiring pattern 16 is formed between an SiN film (silicon oxide film) 18 which is disposed on the lower side and which constitutes an insulating film formed on the substrate 11, and an SiN film 19 which constitutes a protective film. One wiring pattern 16 of the respective wiring patterns 16 is a transmission line 200a for transmitting the high frequency signal, and is connected to an unillustrated high frequency circuit. In the second embodiment, as shown in FIG. 14, ground conductor patterns 201 constructed of an Al film are formed on the both sides of the transmission line 200a (to interpose the transmission line 200a therebetween). Accordingly, the coplanar transmission line is formed on the substrate 11. The ground conductor patterns 201 are also formed between the SiN films 18, 19. The ground conductor pattern is a conductor pattern to be grounded.

Each of the plate spring portions 14 is curved or warped upwardly (in the +Z direction) as shown in FIG. 15 when the electrostatic force is not generated between the driving electrodes 32, 33 (which will be described later on). In the second embodiment, the movable plate 12, the plate spring portions 14, and the connecting portions 15 constitute the movable portion. The movable portion is provided so that the movable portion is movable in the upward-downward direction with respect to the fixed portion such as the substrate 11, and that the spring force is generated to realize restoration to the upper position as shown in FIG. 15. Four pairs of the plate spring portions 14, the connecting portions 15, and the legs 17 are arranged as shown in FIG. 14 with respect to the movable plate 12, to thereby make it possible that the movable plate 12 is movable in the upward-downward direction while maintaining the parallel state with respect to the substrate 11. The components (for example, the substrate 11 and the fixed plate 13) other than the movable plate 12, the plate spring portions 14, and the connecting portions 15 constitute the fixed portion.

As shown in FIGS. 15 and 16, the movable plate 12 has such a structure that an SiN film 21, an Al film 22, an Al film 23, and an SiN film 24 are stacked in this order from the lower side. The SiN film 24, which is disposed on the upper side, has an opening formed at a position corresponding to an electric contact 135 of the fixed plate 13 (which will be described later on), so as to expose an electric contact 136 of the movable plate 12. The Al films 22, 23 of the movable plate 12 are herein referred to as "movable plate conductor portion 31". As shown in FIGS. 15 and 16, a step 12a is formed in order to effect the reinforcement in the vicinity of the circumference of the movable plate 12 (outer circumferential portion). The step 12a is formed over the entire circumference of the outer circumferential portion of the movable plate 12 (movable electrode) which is substantially square. Accordingly, the movable plate 12 is hardly curved or warped by the spring force.

As shown in FIGS. 15 and 16, the connecting portion 15 has such a structure that an SiN film 28, the Al film 23, and the SiN film 24 are stacked in this order from the lower side. The Al film 23 and the SiN film 24 extend continuously as they are from the movable plate 12.

The plate spring portion 14 has such a structure that an SiN film 25, an Al film 26, the Al film 23, and the SiN film 24 are stacked in this order from the lower side. The Al film 23 and the SiN film 24 extend continuously as they are from the connecting portion 15. The plate spring portion 14 is curved upwardly (in the +Z direction) as shown in FIG. 15 by the internal stresses of the films 25, 26, 23, 24 when no electrostatic force is generated between the driving electrodes 32, 33 as will be described later on.

The fixed side driving electrode (first driving electrode) 32, which is constructed of the Al film, is formed in an area opposite to or facing the plate spring portion 14 under or below the plate spring portion 14 functioning as the movable side driving electrode (second driving electrode) 33. The fixed side driving electrode 32 is formed between the SiN films 18, 19 on the substrate 11. The Al films 23, 26 of the plate spring portion 14, especially the Al films 23, 26 in an area opposite to or facing the fixed side driving electrode 32 constitute the movable side driving electrode (second driving electrode) 33. When the voltage is applied between the driving electrodes 32, 33, the electrostatic force is generated between the driving electrodes 32, 33. Accordingly, as shown in FIG. 16, the movable portion (plate spring portion 14, connecting portion 15, and movable plate 12) is moved downwardly, and the movable portion is stopped at a position at which the electrostatic force and the spring force brought about by the plate spring portion 14 are balanced with each other.

The leg 17 has such a structure that the SiN film 25, the Al film 26, the Al film 23, and the SiN film 24 are stacked in this order from the lower side. As for the SiN film 25, the Al film 26, the Al film 23, and the SiN film 24, those which constitute the plate spring portion 14 extend continuously as they are. The SiN film 25 has an opening at each of the legs 17, and is electrically connected via the opening to the wiring patterns 16 (one of which is the transmission line 200a). As shown in FIGS. 15 and 16, a step 17a is formed in order to effect the reinforcement at the outer circumference of the rising portion of the leg 17.

As clarified from the foregoing explanation, in the second embodiment, the movable plate conductor portion 31 and the driving electrode 33 are electrically connected to each other, and are connected to the same wiring patterns 16 of the substrate 11 (one of which is the transmission line 200a) at the leg 17.

As shown in FIGS. 14 to 16, the fixed plate 13 is arranged over or above the movable plate 12 to be opposite or to face the movable plate 12. As shown in FIGS. 14 and 17, the fixed plate 13 is fixed to the substrate 11 by four support portions 41 so that the fixed plate 13 is not moved with respect to the substrate 11. The fixed plate 13 is basically constructed by a fixed plate conductor portion 34 formed of an Al film 27. The fixed plate 13 has the electric contact 135 which is constructed of the Al film 27 and which protrudes downwardly. SiN films may be formed on the upper surface and the lower surface of the fixed plate conductor portion 34, except for the portion of the fixed plate conductor portion 34 at which the electric contact 135 is arranged. The electric contact 135 makes contact with and separation from the electric contact 136 of the movable plate 12 as described later on. In the second embodiment, the electric contact 136 of the movable plate 12 is the portion of the movable plate (conductor) 12 which makes contact and separation with respect to the electric contact 135 of the fixed plate 13 (specifically, the portion of the Al film 23 opposite to or facing the contact 135 via the opening formed through the SiN film 24 corresponding to the electric contact 135). Therefore, the electric contact 136 of the movable plate 12 is electrically connected to the transmission line 200a via the movable plate conductor portion 31, the connecting portion 15, the plate spring portion 14, and the leg 17.

Each of the support portions 41 has two legs (anchors) 41a, a support portion-body 41b, and a connecting portion 41c. The leg (anchor) 41a has a rising portion which rises from the substrate 11. The support portion-body 41b is fixed to the substrate 11 by the legs 41a. The connecting portion 41c connects the support portion-body 41b and the fixed plate 13. As shown in FIG. 17, the connecting portion 41c is constructed such that the Al film 27, constructing the fixed plate conductor portion 34 of the fixed plate 13, extends continuously as it is. The support portion-body 41b has such a structure that an SiN film 51, an Al film 52, an Al film 53, an SiN film 54, and the Al film 27 are stacked in this order from the lower side. The Al film 27 extends continuously from the connecting portion 41c as it is. A gap 91 is provided between the SiN film 54 and the Al film 27. The leg 41a has such a structure that the SiN film 51, the Al film 52, the Al film 53, and the Al film 27 are stacked in this order from the lower side. The SiN film 51, the Al film 52, the Al film 53, and the Al film 27 are constructed such that those which constitute the support portion-body 41b extend continuously as they are. A step is formed in order to effect the reinforcement at the outer circumference of the rising portion of the leg 41a.

As shown in FIGS. 14 and 18, the fixed plate conductor portion 34 of the fixed plate 13 is electrically connected via a connecting portion 61 to a transmission line 200b which transmits the high frequency signal. The transmission line 200b is formed between the SiN films 18, 19 on the substrate 11. The transmission line 200b is a wiring pattern constructed of an Al film, and is connected to the unillustrated high frequency circuit. In the second embodiment, ground conductor patterns 201 constructed of an Al film are formed on the both sides of the transmission line 200b to interpose the transmission line 200b therebetween. Accordingly, the coplanar transmission line is constructed on the substrate 11.

The connecting portion 61 includes a leg (anchor portion) 61a, a connecting plate portion 61b as the first tier, a leg 61c, and a connecting plate portion 61d as the second tier. The leg (anchor portion) 61a has a rising portion which rises from the substrate 11 via the transmission line 200b. The connecting plate portion 61b as the first tier has an end on the −X side which is fixed to the substrate 11 via the leg 61a. The leg 61c has a rising portion which rises from a portion, of the connecting plate portion 61b, disposed on the +X side. As for the connecting plate portion 61d as the second tier, an end on the −X side is fixed to the connecting plate portion 61b via the leg 61c, and an end on the +X side is connected to the −X side of the fixed plate 13.

As shown in FIG. 18, the connecting plate portion 61d and the leg 61c are formed such that the Al film 27, which constructs the fixed plate conductor portion 34 of the fixed plate 13, extends continuously as it is. The connecting plate portion 61b has such a structure that an SiN film 71, an Al film 72, an Al film 73, and an SiN film 74 are stacked in this order from the lower side. The SiN film 74 has an opening formed at the connecting plate portion 61b. The Al film 27 of the leg 61c is electrically connected to the Al film 73 (as well as to the Al film 72) via the opening. The leg 61a has such a structure that the SiN film 71, the Al film 72, the Al film 73, and the SiN film 74 are stacked in this order from the lower side. As for the SiN film 71, the Al film 72, the Al film 73, and the SiN film 74, those which construct the connecting plate portion 61b extend continuously as they are. The SiN film 71 has an opening formed at the leg 61a. The Al film 72 is electrically connected to the transmission line 200b via the opening.

As understood from the foregoing explanation, in the second embodiment, the electric contact 135 of the fixed plate 13 is electrically connected to the transmission line 200b via the connecting portion 61 and the fixed plate conductor portion 34 of the fixed plate 13.

FIG. 19 shows an electric circuit of the micro switch 301 according to the second embodiment focusing attention on the high frequency signal. As shown in FIG. 19, by bringing the electric contact 135 of the fixed plate and the electric contact 136 of the movable plate 12 into contact with each other or separating the electric contact 135 and the electric contact 136 from each other, the both contacts 135, 136 are brought into conduction, or the both contacts 135, 136 are cut off or disconnected. In accordance with this ON/OFF operation, the high frequency signal, inputted into one transmission line 200a, is transmitted to or intercepted (blocked) from the other transmission line 200b.

It goes without saying that it is allowable that the electric contact 136 is made to protrude without making the electric contact 135 to protrude, or that both of the contacts 135, 136 are made to protrude. Also in this modification, it is possible to reduce the fear of the occurrence of the phenomenon called "sticking" in which the fixed plate conductor portion 34 and the movable plate conductor portion 31 are stuck to each other and not separated from each other.

In the second embodiment, when the electrostatic force is not generated between the driving electrodes 32, 33, as shown in FIG. 15, the electric contact 136 of the movable plate 12 abuts against the electric contact 135 of the fixed plate 13. Further, in the abutting state, the force (contacting pressure), with which the electric contact 136 is pressed against the electric contact 135 by the spring force of the plate spring portions 14, is brought about by the stress, etc. of the plate spring portions 14, and the insertion loss (loss caused by the contact resistance between the contacts 135, 136) is sufficiently decreased. That is, the movable plate 12 is displaced while being slightly pushed and lowered downwardly by the fixed plate 13 in the initial state, thereby generating the initial spring force and enhancing the contact pressure. Even when the spring constants of the plate spring portions 14 are not raised, it is possible to enhance the contact pressure.

In the state that the voltage is not applied between the driving electrodes 32, 33 and the electrostatic force is not generated therebetween, as shown in FIG. 15, the electric contact 136 of the movable plate 12 and the electric contact 135 of the fixed plate 13 make contact with each other at a constant contact pressure. As a result, the micro switch 301 is in the ON state. The high frequency signal inputted into one transmission line 200a is transmitted via the electric contacts 135, 136 to the other transmission line 200b.

When the voltage is applied between the driving electrodes 32, 33 and thus the electrostatic force is generated therebetween, then the movable portion (plate spring portion 14, connecting portion 15, and movable portion 12) is moved downwardly against the spring force as shown in FIG. 16, and the electric contact 136 of the movable plate 12 is separated from the electric contact 135 of the fixed plate 13. As a result, the micro switch 301 is in the OFF state. The high frequency signal is not transmitted from the transmission line 200a to the transmission line 200b.

As clarified from the foregoing explanation, in the second embodiment, the fixed side driving electrode 32 is arranged at a relatively lower position and the movable side driving electrode 33 is arranged at a relative upper position, while the fixed side electric contact 135 is arranged at a relatively upper position and the movable side electric contact 136 is arranged at a relatively lower position. The vertical positional relationship between the fixed side and the movable side of the driving electrodes 32, 33 is opposite to the vertical positional relationship between the fixed side and the movable side of the electric contacts 135, 136. Accordingly, in the second embodiment, the electrostatic force generated between the driving electrodes 32, 33 is generated in a direction in which the spacing distance between the electric contacts 135, 136 is widened, in relation to the electrodes 32, 33 and the electric contacts 135, 136.

Therefore, in the second embodiment, even when the applied voltage applied between the driving electrodes 32, 33 is the voltage which is extremely lower than the pull-in voltage, the movable portion (plate spring portion 14, connecting portion 15, and movable plate 12) is moved downwardly, and the electric contacts 135, 136 are separated from each other. The micro switch 301 is in the OFF state as starting from the ON state, and thus the micro switch 301 is capable of performing the switching function. Therefore, the size of the spacing distance between the electric contacts 135, 136 in the OFF state determines the isolation performance of the high frequency signal. However, in the second embodiment, the switching can be performed, without utilizing the pull-in phenomenon, by designing the movable distance of such a degree that the isolation is sufficiently maintained. Specifically, the design may be made such that the distance, which is not more than about ⅓ of the distance between the driving electrodes 32, 33 in the state shown in FIG. 15 (more strictly, the distance between the driving electrodes 32, 33 obtained when the electrostatic force is not generated between the driving electrodes 32, 33 assuming that the fixed plate 13 is absent), is the distance at which the isolation can be maintained.

As described above, according to the second embodiment, the vertical positional relationship between the fixed side and the movable side of the driving electrodes 32, 33 is opposite to the vertical positional relationship between the fixed side and the movable side of the electric contacts 135, 136. Therefore, it is possible to avoid the increase in the insertion loss which would be otherwise caused by the shortage of the contact pressure, even when the pull-in phenomenon is not utilized. Further, it is possible to perform the switching operation which follows the voltage control. Therefore, according to the second embodiment, it is possible to perform the switching operation at the driving voltage which is lower than the pull-in voltage, without causing any special inconvenience or problem. When the micro switch 301 according to the second embodiment is driven, the voltage (driving voltage lower than the pull-in voltage), at which the driving electrodes 32, 33 do not undergo the pull-in phenomenon therebetween, can be applied between the driving electrodes 32, 33, when the spacing distance is generated between the electric contacts 135, 136 in order to provide the OFF state, and in the steady or stationary state that the spacing distance is generated thereafter.

Next, an explanation will be made briefly with reference to FIGS. 20 to 23 about an exemplary method for producing the micro switch 301 according to the second embodiment. FIGS. 20 to 23 are schematic sectional views illustrating respective latter half steps of the production method respectively, and approximately correspond to the left half portions of FIGS. 15 and 16. Former half steps for the micro switch 30 before FIG. 20 are the same as the steps shown in FIGS. 5 to 8 for producing the variable capacitor 1 according to the first embodiment, and any illustration of which is omitted.

At first, the SiN film 18 is formed as a film by the thermal oxidation on the upper surface of the silicon substrate 11. An Al film is deposited thereon by the vapor deposition, the sputtering method, or the like (FIG. 5A). After that, the Al film is patterned to provide the shapes of the fixed side driving electrodes 32, the transmission lines 200a, 200b, the ground conductor pattern 201, the wiring patterns 16, and the other wiring patterns by the photolitho-etching method (FIG. 5B).

Subsequently, an SiN film is deposited by the plasma CVD method or the like on the substrate in the state shown in FIG. 5B. A predetermined photolitho-etching step is performed for pattern the SiN film to provide the shape of the SiN film 19 described above (FIG. 6A). After that, photoresists 101, 102, which serve as sacrifice layers, are coated, and a predetermined photolitho-etching step is performed for the photoresists 101, 102 (FIG. 6B).

Subsequently, a photoresist 103, which serves as a sacrifice layer in order to form the reinforcing step, is coated. A predetermined photolitho-etching step is performed for the photoresist 103 (FIG. 7A).

After that, an SiN film is deposited by the plasma CVD method or the like on the substrate in the state shown in FIG. 7A. A predetermined photolitho-etching step is performed to pattern the SiN film into the shapes of the SiN films 21, 25, 51, 71 described above (FIG. 7B).

Subsequently, an Al film is formed as a film by the sputtering or the like on the substrate in the state shown in FIG. 7B. The Al film is patterned into the shapes of the Al films 22, 26, 52, 72 described above (FIG. 8A).

Subsequently, an SiN film is deposited by the plasma CVD method or the like on the substrate in the state shown in FIG. 8A. A predetermined photolitho-etching step is performed to pattern the SiN film into the shape of the SiN film 28 disposed on the lower side of the connecting portion 15 (FIG. 8B).

Subsequently, an Al film is formed as a film by the sputtering or the like on the substrate in the state shown in FIG. 8B. The Al film is patterned into the shapes of the Al films 23, 53, 73 described above (FIG. 20A).

Figure 20A:
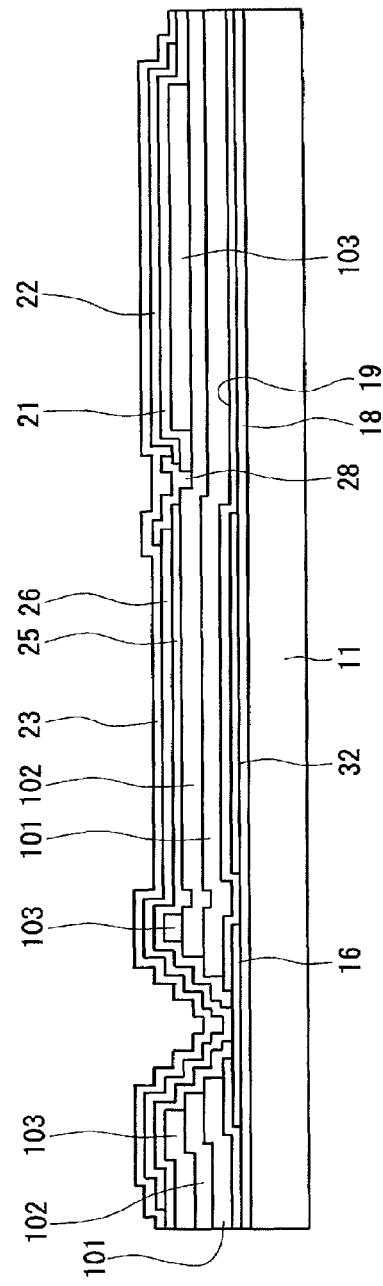
FIGS. 20A and 20B show steps continued from FIG. 8 in relation to the micro switch shown in FIG. 14.
Figure 20B:
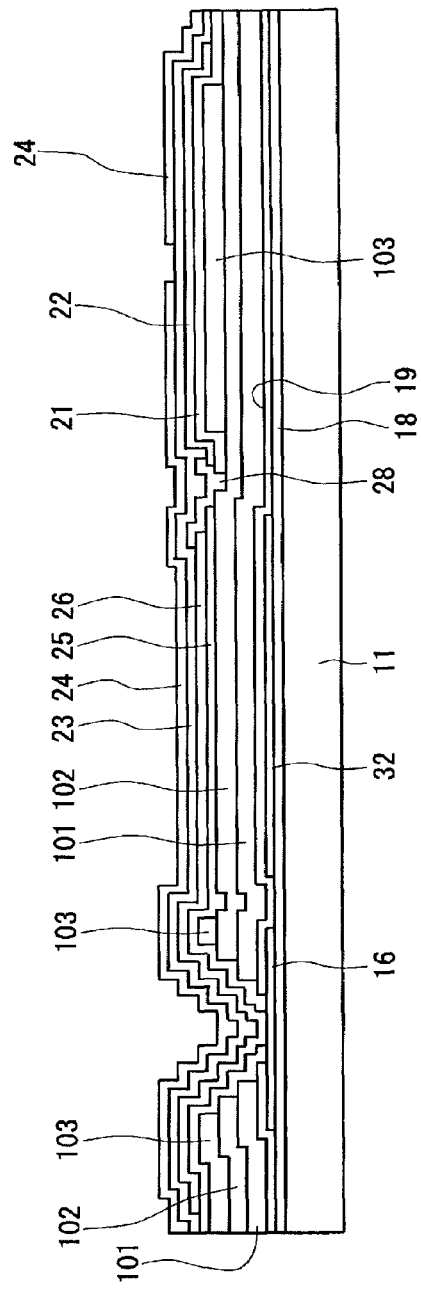

After that, an SiN film is deposited by the plasma CVD method or the like on the substrate in the state shown in FIG. 20A. A predetermined photolitho-etching step is performed to pattern the SiN film into the shapes of the SiN films 21, 25, 54, 74 described above (FIG. 20B).

Figure 21A:
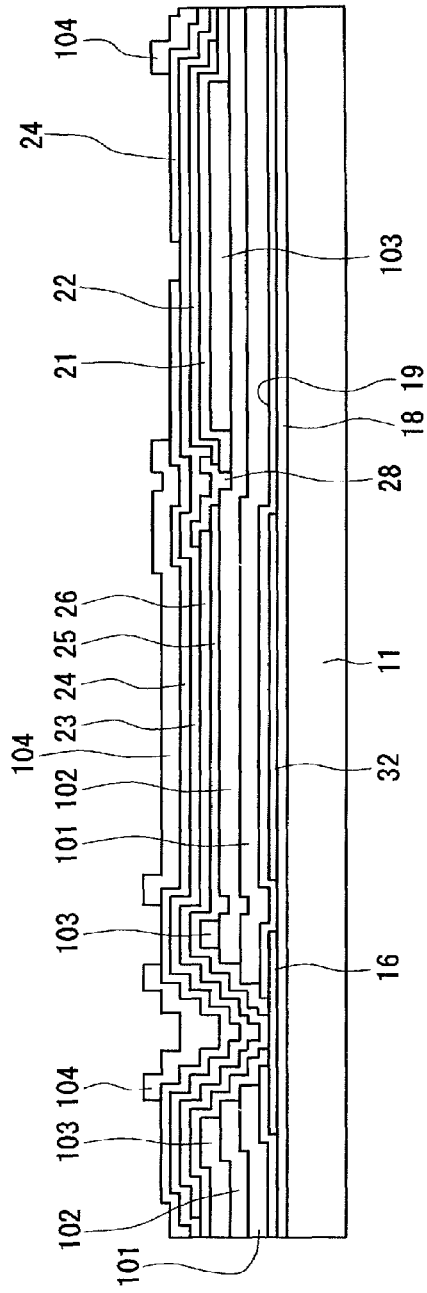
FIGS. 21A and 21B show steps continued from FIG. 20.

Subsequently, a photoresist 104, which serves as a sacrifice layer, is coated for the purpose of padding or plugging. A predetermined photolitho-etching step is performed for the photoresist 104 (FIG. 21A).

Figure 21B:
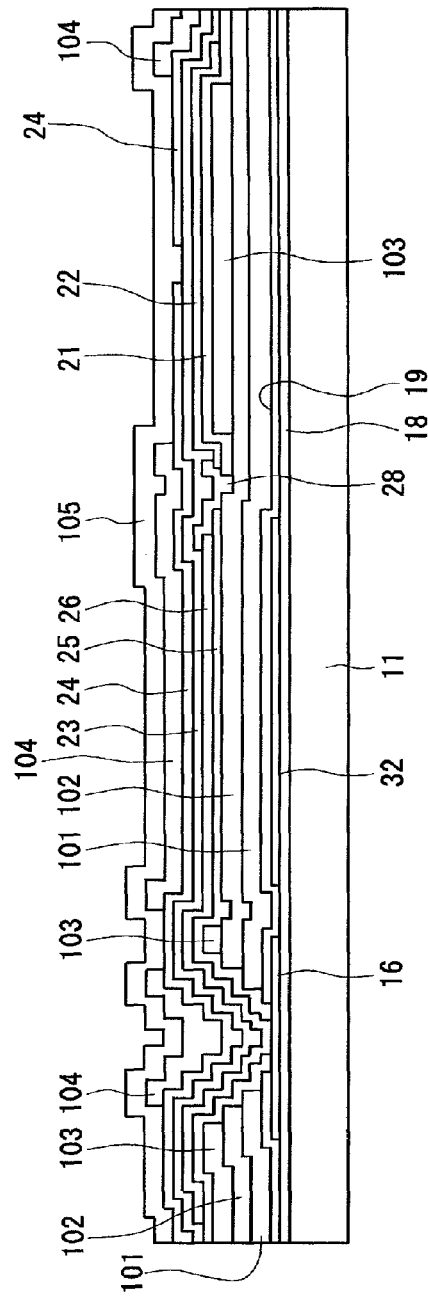

Subsequently, a photoresist 105, which serves as a sacrifice layer, is coated. A predetermined photolitho-etching step is performed for the photoresist 105 (FIG. 21B).

Subsequently, a photoresist 106, which serves as a sacrifice layer in order to form the reinforcing step, is coated. A predetermined photolitho-etching step is performed for the photoresist 105 (FIG. 22).

Figure 22:
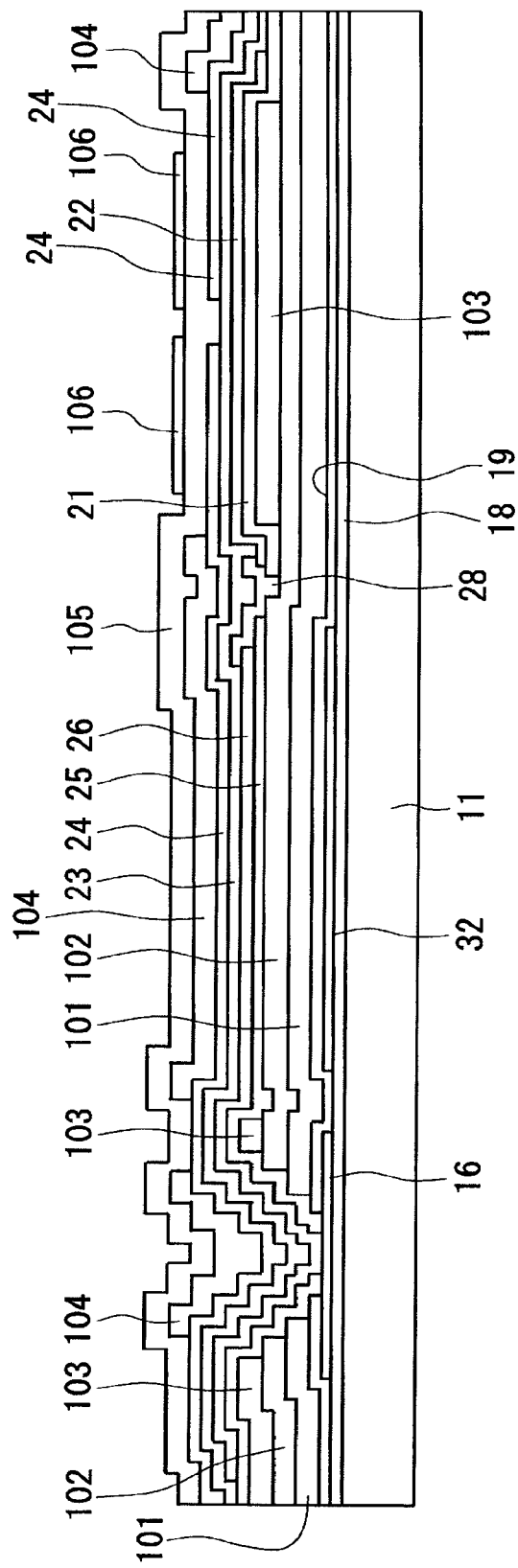
FIG. 22 shows a step continued from FIG. 21.

After that, an Al film is formed as a film by the sputtering or the like on the substrate in the state shown in FIG. 22. The Al film is patterned into the shapes of the Al film 27 described above (FIG. 23A).

Finally, the photoresists 101 to 106, which are the sacrifice layers, are ashed and removed with the oxygen plasma (FIG. 23B). Accordingly, the micro switch 301 according to the second embodiment is completed. When the photoresists 101 to 106 are removed, the plate spring portions 14 are actually curved upwardly as shown in FIG. 15. However, the plate spring portion 14 is depicted in a non-curved state in FIG. 23B so that the production method can be easily understood.

Note that the film formation conditions for the respective films 23 to 26, etc. are determined so that the plate spring portions 14 are curved upwardly as shown in FIG. 15 in accordance with the internal stresses of the films 23 to 26 after removing the photoresists 101 to 106. For example, as for the internal stresses of the films 25, 26, 23, 24, the following procedure is appropriately adopted. That is, the film 25, which is disposed on the lower side of (disposed below) the metal films 26, 23 and which is included in the two SiN films 24, 25 stacked at the plate spring portion 14, is formed so that the compressive stress is allowed to remain. Further, the film 24, which is disposed on the upper side of (disposed above) the metal films 26, 23, is formed so that the tensile stress is allowed to remain. The stresses of the two SiN films 24, 25 can be changed, for example, by changing the gas component ratio and/or the electric power during the film formation. In this embodiment, the two films 24, 25 are formed of SiN. However, the two films 24, 25 may be formed of mutually different materials (for example, SiO$_2$ and SiN). Accordingly, the plate spring portions 14 are curved upwardly when the sacrifice layers are removed, as will be described later on. Other than the above, for example, the plate spring portion 14 may be curved upwardly by forming three or more layers of Al films at the plate spring portion 14. Further, other than the above, for example, the plate spring portion 14 may be curved upwardly by allowing the film formation area or areal size of the lower film 25 and the film formation area or areal size of the upper film 24 to differ.

Although not shown in the drawings, holes for the etching are provided beforehand at appropriate positions in order that the photoresists 101 to 106 can be completely removed. For example, holes for the etching are provided beforehand through the Al film 27 for constructing the fixed plate conductor portion 34 of the fixed plate 13.

The support portions 41 and the connecting portion 61 are not shown in FIGS. 5 to 23. However, as appreciated from the foregoing explanation, the support portions 41 and the connecting portion 61 are simultaneously formed concurrently with the steps shown in FIGS. 5 to 23.

According to the second embodiment, as described above, an advantage is obtained such that the switching operation can be performed at the driving voltage lower than those used in the conventional technique (at the driving voltage lower than the pull-in voltage) without causing any special inconvenience or problem which would be otherwise caused such that the insertion loss is consequently increased.

The micro switch 301 according to the second embodiment can be used not only as the high frequency switch but also as a switch for performing the switching for DC and low frequency signals.

Third Embodiment

Figure 24:
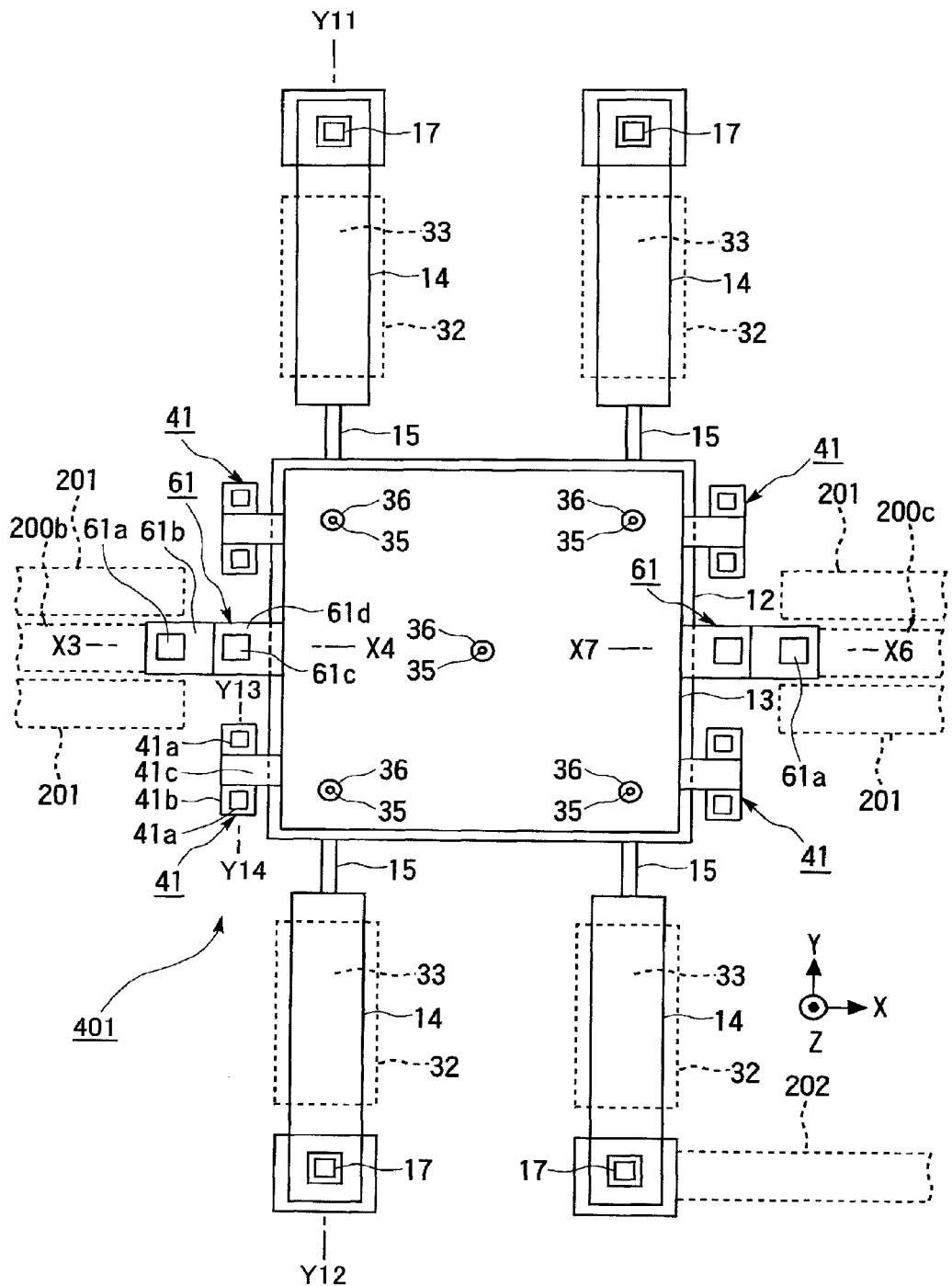
FIG. 24 shows a schematic plan view of a general construction of a micro switch according to a third embodiment of the present invention.
Figure 25:
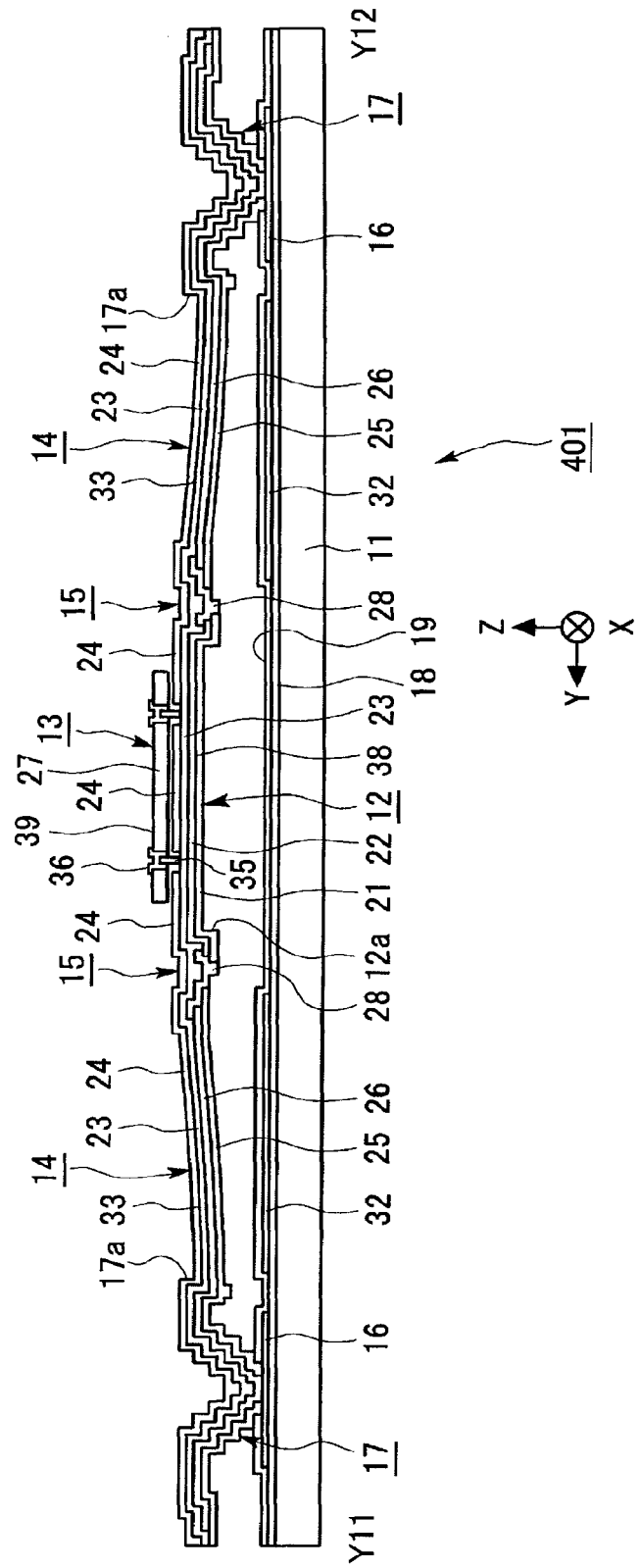
FIG. 25 shows a schematic sectional view taken along a line Y11-Y12 shown in FIG. 24 in a state that no electrostatic force is generated between driving electrodes.
Figure 26:
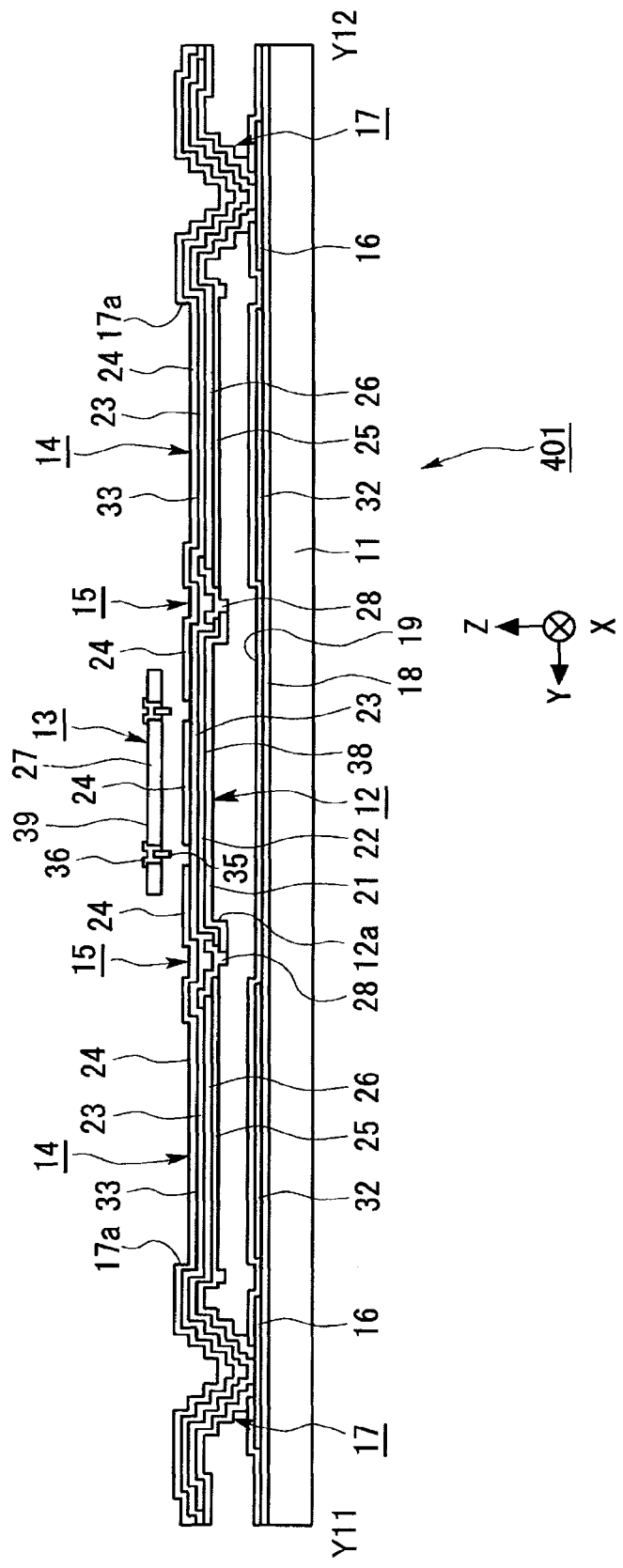
FIG. 26 shows a schematic sectional view taken along the line Y11-Y12 shown in FIG. 24 in a state that the electrostatic force is generated between the driving electrodes.

FIG. 24 shows a schematic plan view of a general construction of a micro switch (MEMS switch in this embodiment) 401 according to the third embodiment of the present invention. FIGS. 25 and 26 each show a schematic sectional view taken along a line Y11-Y12 shown in FIG. 24. FIG. 25 shows a state that no electrostatic force is generated between driving electrodes 32, 33. FIG. 26 shows a state that the electrostatic force is generated between the driving electrodes 32, 33. A cross section taken along a line Y13-Y14 shown in FIG. 24 is the same as the cross section taken along the line Y9-Y10 shown in FIG. 14 (see FIG. 17). A cross section taken along a line X3-X4 shown in FIG. 24 is the same as the cross section taken along the line X1-X2 shown in FIG. 14 (see FIG. 18). A cross section taken along a line X6-X7 shown in FIG. 24 is similar to the cross section taken along the line X1-X2 shown in FIG. 14 (see FIG. 18), except that a transmission line 200c appears in place of the transmission line 200b. In FIGS. 24 to 26, the components, which are the same as or correspond to the components shown in FIGS. 14 to 18 for illustrating the micro switch according to the second embodiment, are designated by the same reference numerals, any duplicate explanation of which will be omitted.

The micro switch 401 according to the third embodiment is constructed as a parallel type switch by modifying the micro switch 301 according to the second embodiment described above. This embodiment is different from the second embodiment described above in only the following points explained below.

In the third embodiment, the Al films 22, 23 of the movable plate 12 provide a movable side capacitance electrode (second capacitance electrode) 38. The fixed plate conductor portion 34 of the fixed plate 13 provides a fixed side capacitance electrode (first capacitance electrode) 39. The capacitance (variable capacitance) of a variable capacitor is formed by the movable side capacitance electrode and the fixed side capacitance electrode. The electric contact 135 is not provided on the fixed plate 13, in accordance with which the electric contact 136 is not present on the movable plate 12 as well. The movable side capacitance electrode 38 and the fixed side capacitance electrode 39 are not in electric contact with each other.

In the third embodiment, the fixed plate 13 is provided with projections 35 which are constructed of an Al film and which protrude (project) downwardly. In order to electrically insulate the projections 35 from the fixed side capacitance electrode 39, projection-holding members 36, which are constructed of an SiN film, are provided between the fixed side capacitance electrode 39 and the projections 35. As clarified in FIG. 25, the projections 35 are allowed to abut against the movable plate 12. Accordingly, the minimum spacing distance is defined between the movable side capacitance electrode 38 and the fixed side capacitance electrode 39. The contact area or areal size between the fixed plate 13 and the movable plate 12 is decreased by the projections 35. Therefore, it is possible to reduce the fear of the occurrence of the phenomenon called "sticking" in which the fixed plate 13 and the movable plate 12 are stuck to each other and are not separated from each other. However, in the present invention, it is not necessarily indispensable to provide the projections 35. The projections 35 as described above may be provided on the side of the movable plate 12. Openings are formed through the SiN film 24 of the movable plate 12 at positions corresponding to the projections 35.

In the second embodiment described above, one wiring pattern 16 of the respective wiring patterns 16 is the transmission line 200a for transmitting the high frequency signal. On the other hand, in the third embodiment, the wiring pattern 16 is a ground conductor pattern 202, instead of the above construction in the second embodiment. Therefore, in the third embodiment, the movable side capacitance electrode 38 is electrically connected to the ground conductor pattern 202.

In the second embodiment, the −X side portion of the fixed side capacitance electrode 39 of the fixed plate 13 is electrically connected, via the connecting portion 61, only to the transmission line 200b for transmitting the high frequency signal. In the third embodiment, however, in addition to this, a +X side portion of the fixed side capacitance electrode 39 of the fixed plate 13 is electrically connected via a connecting portion 61 to a transmission line 200c for transmitting the high frequency signal. The transmission line 200c is a wiring pattern which is constructed of an Al film formed between the SiN films 18, 19 on the substrate 11, and is connected to the unillustrated high frequency circuit. In the third embodiment, ground conductor patterns 201 constructed of an Al film are formed on the both sides of the transmission line 200c. Accordingly, the coplanar transmission line is formed on the substrate 11.

Figure 27:
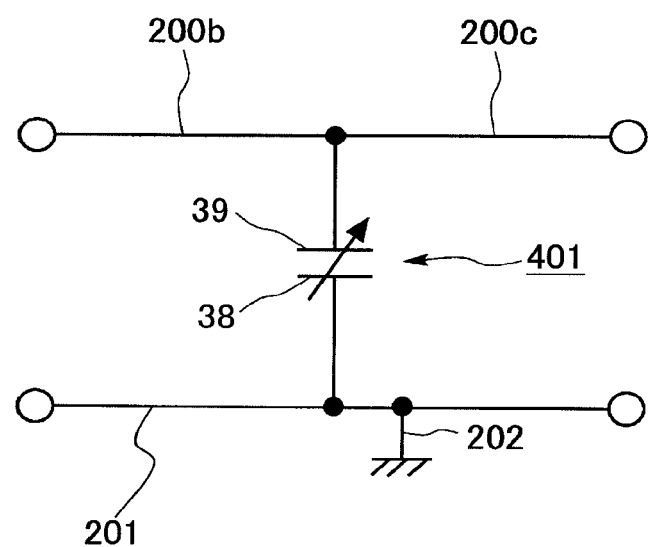
FIG. 27 shows an electric circuit of the micro switch shown in FIG. 24 focusing attention on a high frequency signal.

An electric circuit of the micro switch 401 according to the third embodiment focusing attention on the high frequency signal is now shown in FIG. 27. As shown in FIG. 27, the micro switch 401 according to the third embodiment has the capacitor (capacitance) which is provided in parallel with respect to the high frequency transmission line. The capacitance between the capacitance electrodes 38, 39 is changed by changing the position of the movable side capacitance electrode 38. The high frequency signal inputted into one transmission line 200c is switched between a state of being shunted to the ground conductor pattern 202 (OFF state) and a state of being unshunted (ON state), depending on the changed magnitude of the capacitance. Accordingly, the high frequency signal inputted into one transmission line 200c is transmitted or not transmitted to the other transmission line 200b.

In the third embodiment, when the electrostatic force is not generated between the driving electrodes 32, 33, the movable plate 12 abuts against the projections 35 of the fixed plate 13 as shown in FIG. 25. Further the stress, etc. of the plate spring portion 14 is designed so that the force, with which the movable plate 12 is pressed against the projections 35 by the spring force of the plate spring portion 14 in this situation, is relatively small. In the third embodiment, the design is made such that the spacing distance between the capacitance electrodes 31, 34 is sufficiently small in the state shown in FIG. 25. In order to sufficiently shunt the high frequency signal in the OFF state and sufficiently increase the isolation, it is preferable that, in the state that the electrostatic force is not generated between the driving electrodes 32, 33, the capacitance between the capacitance electrodes 38, 39 is as great as possible. Therefore, it is preferable that the spacing distance between the capacitance electrodes 38, 39 is as narrow (small) as possible in the state that the electrostatic force is not generated between the driving electrodes 32, 33. In this embodiment, the spacing distance is narrower than at least the spacing distance between the driving electrodes 32, 33 (average spacing distance in this embodiment).

In the state that the voltage is not applied between the driving electrodes 32, 33 and the electrostatic force is not generated therebetween, as shown in FIG. 25, the spacing distance between the capacitance electrodes 38, 39 is sufficiently small or decreased, and the capacitance between the capacitance electrodes 38, 39 is sufficiently great or increased. As a result, the micro switch 401 is in the OFF state. The high frequency signal inputted from one transmission line 200c is shunted to the ground conductor pattern 202 by the capacitance between the capacitance electrodes 38, 39, and the high frequency signal is not transmitted to the other transmission line 200b.

When the voltage is applied between the driving electrodes 32, 33 to generate the electrostatic force therebetween, then as shown in FIG. 26, the movable portion (plate spring portion 14, connecting portion 15, and movable plate 12) is moved downwardly, the spacing distance between the capacitance electrodes 38, 39 is increased, and the capacitance between the capacitance electrodes 38, 39 is decreased. As a result, the micro switch 401 is in the ON state. The high frequency signal, inputted from one transmission line 200c, is not shunted to the ground conductor pattern 202 by the capacitance between the capacitance electrodes 38, 39, and the high frequency signal is transmitted to the other transmission line 200b.

As clarified from the foregoing description, in the third embodiment, the fixed side driving electrode 32 is arranged at a relatively lower position and the movable side driving electrode 33 is arranged at a relatively upper position, while the fixed side capacitance electrode 39 is arranged at a relatively upper position and the movable side capacitance electrode 38 is arranged at a relatively lower position. The vertical positional relationship between the fixed side and the movable side of the driving electrodes is opposite to the vertical positional relationship between the fixed side and the movable side of the capacitance electrodes. Accordingly, in the third embodiment, the electrostatic force, which is generated between the driving electrodes 32, 33, is generated in the direction in which the spacing distance between the capacitance electrodes 38, 39 is widened.

Therefore, in the third embodiment, the spacing distance between the capacitance electrodes 38, 39 can be sufficiently narrowed in the OFF state to thereby sufficiently enhance the isolation, without utilizing the pull-in phenomenon. Further, the spacing distance between the capacitance electrodes 38, 39 can be sufficiently narrowed to sufficiently increase the capacitance between the capacitance electrodes 38, 39 in the state that the electrostatic force is not generated between the driving electrodes 32, 33. Therefore, by applying the driving voltage, which is within the range to cause no pull-in phenomenon, between the driving electrodes 32, 33, it is possible to sufficiently increase the ratio between the capacitance which is obtained in this state and the capacitance which is obtained in the state that the electrostatic force is not generated between the driving electrodes 32, 33. This means that in the ON state, the capacitance between the capacitance electrodes 38, 39 can be sufficiently decreased (made small) even when the pull-in phenomenon is not utilized. Therefore, in the third embodiment, it is possible to sufficiently decrease the capacitance between the capacitance electrodes 38, 39 in the ON state without utilizing the pull-in phenomenon, and it is possible to sufficiently lower the insertion loss caused by the micro switch 401 (corresponding to the component which is not transmitted from one transmission line 200c to the other transmission line 200b and which is allowed to flow to the ground conductor pattern 202 via the capacitance in the ON state).

As described above, according to the third embodiment, the vertical positional relationship between the fixed side and the movable side is reversed or made opposite between the driving electrodes 32, 33 and the capacitance electrodes 38, 39. Therefore, it is possible to perform the switching operation, even when the pull-in phenomenon is not utilized, without causing any special inconvenience or problem such as the decrease in the isolation and the increase in the insertion loss. Therefore, according to the third embodiment, the switching operation can be performed at the driving voltage which is lower than the pull-in voltage, without causing any special inconvenience or problem. In a case that the micro switch 401 according to the third embodiment is driven, upon decreasing the capacitance between the capacitance electrodes 38, 39 so as to provide the ON state and in the steady or stationary state that the capacitance is decreased thereafter, the voltage (driving voltage lower than the pull-in voltage), at which the pull-in phenomenon is not caused between the driving electrodes 32, 33, is applied between the driving electrodes 32, 33.

Next, an explanation will be made briefly with reference to FIGS. 28 and 29 about an exemplary method for producing the micro switch 401 according to the third embodiment. FIGS. 28 and 29 are schematic sectional views each illustrating respective steps of the production method, and approximately correspond to the left half portions of FIGS. 25 and 26.

Figure 28A:
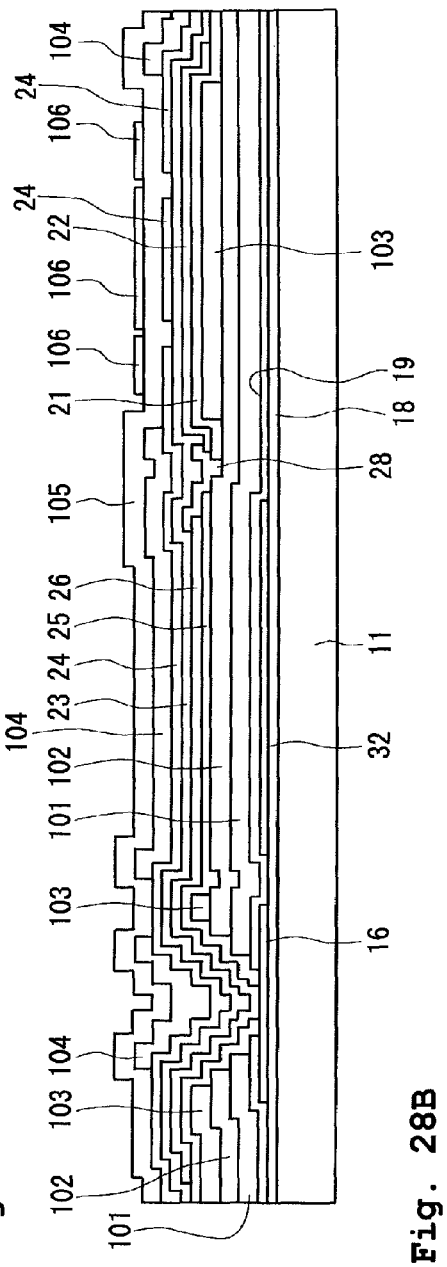
FIGS. 28A and 28B show steps of a method for producing the micro switch shown in FIG. 24.

At first, the steps, which are basically the same as or equivalent to the steps for producing the micro switch 301 shown in FIG. 5A through FIG. 22 in the second embodiment described above, are performed. FIG. 28A shows a state after performing the steps until arrival at this situation.

Subsequently, an Al film is formed as a film on the substrate in the state shown in FIG. 28A. The Al film is patterned into the shapes of the Al film 27 and the projections 35 described above (FIG. 28B).

Figure 28B:
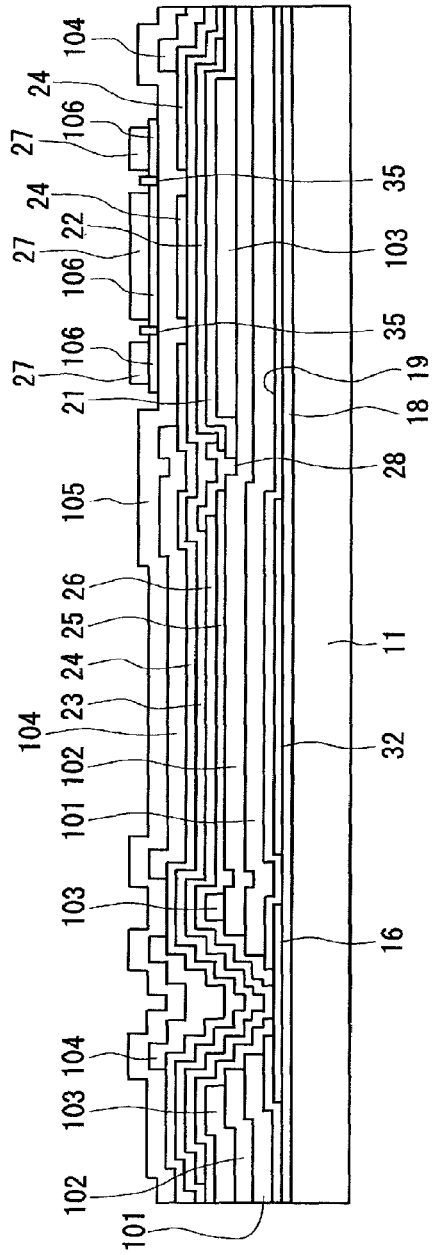

After that, an SiN film is deposited by the plasma CVD method or the like on the substrate in the state shown in FIG. 28B. A predetermined photolitho-etching step is performed to pattern the SiN film into the shape of the projection-holding members 36 described above (FIG. 29A).

Finally, the photoresists 101 to 106, which are the sacrifice layers, are ashed and removed with the oxygen plasma (FIG. 29B). Accordingly, the micro switch 401 according to the third embodiment is completed. When the photoresists 101 to 106 are removed, the plate spring portions 14 are curved upwardly as shown in FIG. 25. However, FIG. 29B is shown without curving the plate spring portion 14 so that the production method can be understood easily.

According to the third embodiment, as described above, an advantage is obtained such that the switching operation can be performed at the low driving voltage as compared with the conventional technique (at the driving voltage lower than the pull-in voltage), without causing any special inconvenience or problem such as the decrease in the isolation and the increase in the insertion loss.

The specific embodiments of the present invention have been explained above. However, the present invention is not limited to the embodiments.

For example, the film structures or constructions of the respective portions (for example, the number of layers and the materials) are not limited to those described above by way of example.

In the first embodiment, the second embodiment, and the third embodiment, the movable plate 12 is supported by the two pairs of the plate spring portions 14 from the both sides thereof. Alternatively, the movable plate 12 may be supported by one pair of the plate spring portions 14 from the both sides thereof, or the movable plate 12 may be supported by three or more pairs of the plate spring portions 14. A part or parts of the plurality of pairs of the plate spring portions 14 may support the movable plate 12 in the X direction.

The first embodiment is the example of the variable capacitor 1 of the MEMS type, and the second embodiment and the third embodiment are the examples of the micro switches 301, 401 of the MEMS type. Other than the above, for example, the MEMS type electronic element as described above can be utilized to variably control the electric characteristic, etc. in any electronic element other than the variable capacitor and the micro switch, by providing a first signal electrode portion for the fixed portion 13 and providing a second signal electrode portion for the movable portion 12 and by controlling the spacing distance between the first signal electrode portion and the second signal electrode portion.

Further, other than the above, for example, the structure of MEMS of the present invention is also usable, for example, as an actuator for driving an optical member (driving-objective portion) including a lens, a mirror, etc., other than the electronic element. Specifically, for example, an optical member (driving-objective portion) OE1 is arranged on the movable portion 12, and the optical member (driving-objective portion) can be driven by applying the voltage applied between the first driving electrode portion and the second driving electrode portion to generate the electrostatic force, between the first driving electrode portion and the second driving electrode portion, resisting against the spring force. In this case, another optical member OE2 such as a lens or a mirror may be arranged on the fixed portion 13. Alternatively, it is also allowable that the fixed portion 13 is absent or omitted. For example, a focusing mechanism can be constructed by providing the lenses on the fixed portion 13 and the movable portion 12. Alternatively, the mirrors may be provided on the fixed portion 13 and the movable portion 12 so as to function as an interferometer. When the MEMS structure of the present invention is utilized as the actuator, the actuator can be driven within a movement range which is equivalent to or not less than that of the conventional MEMS structure, while driving the actuator within a voltage range which is smaller than the pull-in voltage. The movable portion 12 and the plate spring portions 14 disposed on the both sides of the movable portion 12 are curved to protrude as a whole by the internal stress. Therefore, the spacing distance between the movable portion 12 and the substrate 11 is widened, and the movement range is widened corresponding to the widened amount. The capacitance electrode (signal electrode) can be omitted depending on the way of use of the actuator. The actuator may be formed by any technique other than the MEMS technique in which the semiconductor production process is applied.

In the MEMS type electronic elements described in the first to third embodiments, the plate spring portion 14 has the structure in which the thin films are stacked; the thin film 25, which is disposed under or below the Al films 23, 26, is formed so that the compressive stress remains; and the thin film 24, which is disposed over or above the Al films 23, 26, is formed so that the tensile stress remains. The two pairs of the plate spring portions 14 are curved or warped as a whole by the stress generated by the foregoing stresses to protrude from the substrate 11 toward the fixed plate 13. Therefore, the protruding curve or warpage can be formed by the MEMS production technique. For example, in the semiconductor chip, a variable capacitor and a switch can be realized by using the MEMS type electronic element.

The way of use of the variable capacitor according to the present invention is not specifically limited. However, for example, the variable capacitor according to the present invention is usable in the impedance matching, the variable filter, the phase shifter, VCO (voltage control oscillator), etc.

When the micro switch according to the present invention is used as an RF switch, the way of use thereof is not specifically limited. However, for example, the micro switch according to the present invention is usable for the signal selector switch for the transmitting/receiving circuit, the variable filter selector switch, etc.

What is claimed is:
1. An optical element comprising:
a substrate,
a fixed portion,
a movable portion,
a first driving electrode,
a second driving electrode, and
a first optical member arranged on the movable portion;
wherein the fixed portion is arranged on the substrate so that the fixed portion is separated from the substrate by a predetermined spacing distance,
the movable portion is movable with respect to the fixed portion and is provided to generate a spring force to cause restoration of the movable portion to a predetermined position,
an electrostatic force is generated between the first driving electrode and the second driving electrode by a voltage applied between the first driving electrode and the second driving electrode so that the electrostatic force resists against the spring force, and
the movable portion continues to be urged by the spring force to contact with the fixed portion during a period in which the voltage is not applied between the first driving electrode and the second driving electrode, and
the movable portion has a movable plate and plate spring portions arranged on both sides of the movable plate in a predetermined direction, the plate spring portions each having the second driving electrode thereon, and
the second driving electrode is constructed to be warped when the electrostatic force is generated between the first driving electrode and the second driving electrode.

2. The optical element according to claim 1, wherein the movable portion is supported by the spring portions so that the movable portion is positioned between the substrate and the fixed portion.

3. The optical element according to claim 1, wherein the first optical member is a lens.

4. The optical element according to claim 3, further comprising a second optical member arranged on the fixed portion, wherein the first optical member and the second optical member constitute a focusing mechanism.

5. The optical element according to claim 1, wherein the first optical member is a mirror.

6. The optical element according to claim 5, further comprising a second optical member arranged on the fixed portion, wherein the first optical member and the second optical member constitute an interferometer.

7. The optical element according to claim 1, further comprising a second optical member arranged on the fixed portion.

8. The optical element according to claim 7, wherein the second optical member is a lens.

9. The optical element according to claim 7, wherein the second optical member is a mirror.

* * * * *